US012563841B2

(12) United States Patent
Lin et al.

(10) Patent No.: US 12,563,841 B2
(45) Date of Patent: Feb. 24, 2026

(54) ELECTROSTATIC DISCHARGE (ESD) PROTECTION CIRCUIT

(71) Applicant: TEXAS INSTRUMENTS INCORPORATED, Dallas, TX (US)

(72) Inventors: Kuo Yao Lin, Garland, TX (US); Akram Salman, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/855,468

(22) Filed: Jun. 30, 2022

(65) Prior Publication Data

US 2024/0006407 A1     Jan. 4, 2024

(51) Int. Cl.
H10D 89/60 (2025.01)

(52) U.S. Cl.
CPC .................................. H10D 89/814 (2025.01)

(58) Field of Classification Search
CPC .................................................... H01L 27/0274
USPC .......................................................... 257/355
See application file for complete search history.

(56) References Cited

U.S. PATENT DOCUMENTS

| | | | | |
|---|---|---|---|---|
| 5,827,765 A | * | 10/1998 | Stengl | .................. H10B 12/373 |
| | | | | 257/E21.651 |
| 6,339,228 B1 | * | 1/2002 | Iyer | ......................... H01L 22/34 |
| | | | | 438/391 |
| 6,627,513 B1 | * | 9/2003 | Tsai | ......................... H01L 22/34 |
| | | | | 257/E21.651 |

| | | | | |
|---|---|---|---|---|
| 2002/0195648 A1 | * | 12/2002 | Hirata | ................. H01L 27/0274 |
| | | | | 438/257 |
| 2004/0209436 A1 | * | 10/2004 | Chen | .................... H10B 12/038 |
| | | | | 257/E21.651 |
| 2006/0186472 A1 | * | 8/2006 | Ito | ........................ H01L 27/1203 |
| | | | | 257/347 |
| 2008/0042208 A1 | * | 2/2008 | Hshieh | .............. H01L 29/66727 |
| | | | | 257/E21.409 |

(Continued)

FOREIGN PATENT DOCUMENTS

| | | | |
|---|---|---|---|
| CN | 1610098 | * | 4/2005 |
| CN | 1324682 | * | 7/2007 |

(Continued)

*Primary Examiner* — Sheng-Bai Zhu

(74) *Attorney, Agent, or Firm* — Andrew R. Ralston; Frank D. Cimino

(57) ABSTRACT

The present disclosure generally relates to an electrostatic discharge (ESD) protection circuit in an integrated circuit and methods of forming such. In an example, an integrated circuit includes a transistor, a doped buried layer, and a capacitor. The transistor includes source and drain regions and a gate structure. The source and drain regions have a first conductivity type and are disposed in a semiconductor layer. The semiconductor layer has an opposite second conductivity type. The doped buried layer has the first conductivity type disposed in the semiconductor layer below the source and drain regions. The capacitor is disposed in the semiconductor layer and includes first and second capacitor electrodes extending to the doped buried layer. The first capacitor electrode electrically couples the drain region. The second capacitor electrode electrically couples the gate structure and conductively contacts the doped buried layer. The doped buried layer electrically couples the source region.

20 Claims, 16 Drawing Sheets

(56)          References Cited

U.S. PATENT DOCUMENTS

| 2008/0111154 | A1* | 5/2008 | Voldman | ............. | H01L 21/8249 |
| | | | | | 257/E27.098 |
| 2012/0025288 | A1* | 2/2012 | Doris | ..................... | H10B 12/37 |
| | | | | | 438/386 |
| 2013/0128400 | A1* | 5/2013 | Yeh | ........................ | H02H 9/046 |
| | | | | | 361/56 |

FOREIGN PATENT DOCUMENTS

| CN | 101064282 | * | 10/2007 |
| CN | 100499146 | * | 6/2009 |
| CN | 101764155 | * | 6/2010 |
| CN | 212517201 | * | 2/2021 |
| JP | 2001345433 | * | 12/2001 |
| JP | 2008177228 | * | 7/2008 |

* cited by examiner

ELECTROSTATIC DISCHARGE (ESD) PROTECTION CIRCUIT

BACKGROUND

An electrostatic discharge (ESD) event can occur when one object accumulates a static charge and comes into close proximity to or contact with another object with a different charge (which may be a small charge or no charge). The higher accumulated charge from one object is discharged to the object with the lower charge. The initial difference between the charges of the objects can be large, which can result in a large flow of current as a result of the discharge. In electronic devices, the generally sudden and large flow of current resulting from an ESD event can damage electrical components. For this reason, an ESD protection circuit may be included in an electronic device, such as an integrated circuit, to dissipate the charge and divert the flow of current away from electrical components that could otherwise be damaged by an ESD event.

SUMMARY

This Summary is provided to introduce a brief selection of disclosed concepts in a simplified form that are further described below in the Detailed Description including the drawings provided. Various disclosed devices and methods may be beneficially applied to an integrated circuit that includes an electrostatic discharge (ESD) protection circuit. While such examples may be expected to reduce the footprint and area of such ESD protection circuits, no particular result is a requirement unless explicitly recited in a particular claim.

An example described herein is an integrated circuit. The integrated circuit includes a transistor, a doped buried layer, and a capacitor. The transistor includes a source region, a drain region, and a gate structure. The source region and the drain region have a first conductivity type and are disposed in a semiconductor layer. The semiconductor layer has an opposite second conductivity type. The gate structure is disposed on or over the semiconductor layer. The doped buried layer has the first conductivity type disposed in the semiconductor layer below the source region and the drain region. The capacitor is disposed in the semiconductor layer. The capacitor includes a first capacitor electrode and a second capacitor electrode. The first and second capacitor electrodes extend from a top surface of the semiconductor layer to the doped buried layer. The capacitor further includes a capacitor dielectric layer disposed between the first capacitor electrode and the second capacitor electrode. The first capacitor electrode is electrically coupled to the drain region. The second capacitor electrode is electrically coupled to the gate structure and conductively contacts the doped buried layer. The doped buried layer is electrically coupled to the source region.

Another example is a method of forming an integrated circuit. The method includes forming a doped buried layer in a semiconductor substrate; forming a first capacitor electrode along a sidewall of the semiconductor substrate; forming a capacitor dielectric layer disposed along the first capacitor electrode disposed along the sidewall; forming a second capacitor electrode along the capacitor dielectric layer; forming a gate structure disposed on or over the semiconductor substrate; forming a source region and a drain region disposed in the semiconductor substrate and on opposing lateral sides of the gate structure; electrically coupling the first capacitor electrode to the gate structure;

electrically coupling the second capacitor electrode to the drain region; and electrically coupling the doped buried layer to the source region. The first capacitor electrode contacts the doped buried layer.

A further example is an integrated circuit. The integrated circuit includes an electrostatic discharge (ESD) protection circuit. The ESD protection circuit includes a transistor, an effective resistance, and an effective capacitance. The transistor includes a source region, a drain region, and a gate structure. The source region and the drain region are disposed in a semiconductor substrate. The gate structure is disposed on or over the semiconductor substrate. The effective resistance includes a doped buried layer disposed in the semiconductor substrate below the transistor. The doped buried layer is electrically coupled between the gate structure and the source region. The effective capacitance is disposed in the semiconductor substrate and is electrically coupled between the gate structure and the drain region. The effective capacitance includes a first capacitor electrode, a capacitor dielectric layer, and a second capacitor electrode. The first capacitor electrode is disposed along a first sidewall in the semiconductor substrate. The first capacitor electrode electrically contacts the doped buried layer. The first capacitor dielectric layer is disposed along the first capacitor electrode disposed along the first sidewall. The second capacitor electrode is disposed along the first capacitor dielectric layer.

The foregoing summary outlines rather broadly various features of examples of the present disclosure in order that the following detailed description may be better understood. Additional features and advantages of such examples will be described hereinafter. The described examples may be readily utilized as a basis for modifying or designing other examples that are within the scope of the appended claims.

BRIEF DESCRIPTION OF THE DRAWINGS

So that the manner in which the above recited features can be understood in detail, reference is made to the following detailed description taken in conjunction with the accompanying drawings.

Figure 1:
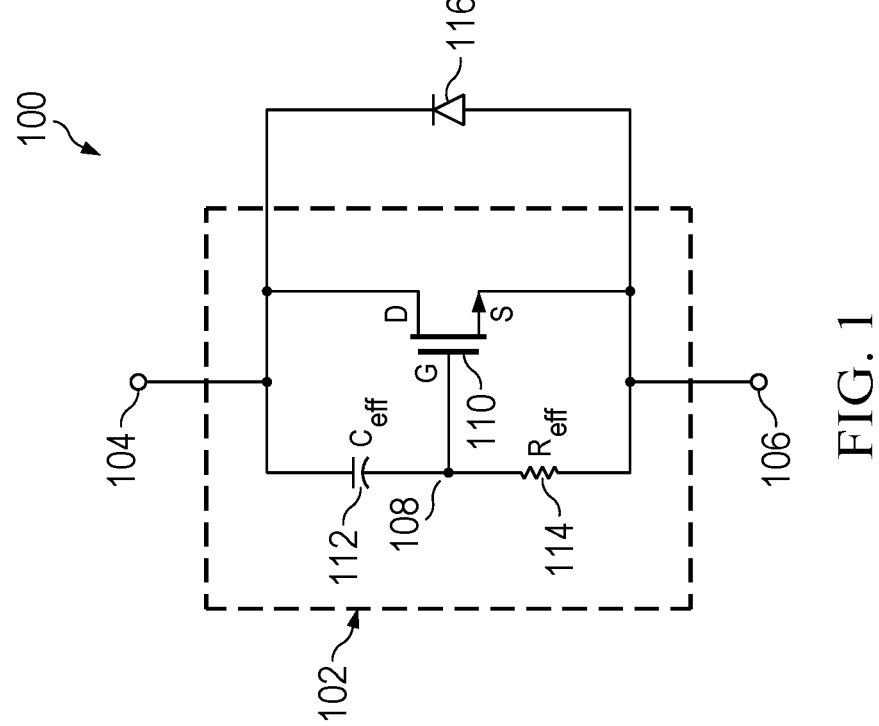
FIG. 1 is a circuit schematic of an electrostatic discharge (ESD) protection circuit according to some examples.

The drawings, and accompanying detailed description, are provided for understanding of features of various examples and do not limit the scope of the appended claims. The examples illustrated in the drawings and described in the accompanying detailed description may be readily utilized as a basis for modifying or designing other examples that are within the scope of the appended claims. Identical reference numerals may be used, where possible, to designate identical elements that are common among drawings. The figures are drawn to clearly illustrate the relevant elements or features and are not necessarily drawn to scale.

DETAILED DESCRIPTION

Various features are described hereinafter with reference to the figures. An illustrated example may not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. In the following discussion, doping levels may be described in quantitative and/or qualitative terms, wherein a doping level less than $1 \times 10^{16}$ cm$^{-3}$ is lightly doped, a doping level between $1 \times 10^{16}$ cm$^{-3}$ and $1 \times 10^{18}$ cm$^{-3}$ is moderately doped, a doping level between $1 \times 10^{18}$ cm$^{-3}$ and $1 \times 10^{20}$ cm$^{-3}$ is heavily doped, and a doping level above $1 \times 10^{20}$ cm$^{-3}$ is very heavily doped. A doping level at the boundaries of these ranges may be referred to qualitatively by either term referring to the higher or lower range.

The present disclosure relates generally, but not exclusively, to an electrostatic discharge (ESD) protection circuit in an integrated circuit and methods of forming the ESD protection circuit. More particularly, the present disclosure relates generally, but not exclusively, to a gate-coupled transistor cell in an ESD protection circuit and methods of forming the gate-coupled transistor cell. In some examples, a gate-coupled transistor cell includes a transistor, an effective capacitance, and an effective resistance. The effective capacitance is electrically coupled between the drain region of the transistor and the gate structure of the transistor. The effective resistance is electrically coupled between the source region of the transistor and the gate structure of the transistor. The effective capacitance includes one or more capacitors disposed in a semiconductor substrate in which the source region and drain region of the transistor are disposed. The effective resistance includes a resistance of an electrical path through, at least in part, a doped buried layer disposed in the semiconductor substrate below the source region and the drain region of the transistor. Accordingly, with a resistance resulting from the doped buried layer disposed in the semiconductor substrate below the source and drain regions and/or with the capacitance formed disposed in the semiconductor substrate, some examples can achieve a reduced footprint and/or area of the gate-coupled transistor cell. Other benefits and advantages can be achieved.

FIG. 1 is a circuit schematic of an ESD protection circuit 100 according to some examples. The ESD protection circuit 100 includes a gate-coupled transistor cell 102 electrically coupled or connected between a first circuit node 104 and a second circuit node 106. The gate-coupled transistor cell 102 includes a transistor 110 having a source, a drain, and a gate. The transistor 110 in this example is an n-type field effect transistor (NFET), such as an n-type metal-oxide-semiconductor (NMOS) transistor. The gate-coupled transistor cell 102 further includes a capacitor 112 and resistor 114. The capacitor 112 has an effective capacitance $C_{eff}$, and the resistor 114 has an effective resistance $R_{eff}$.

The drain of the transistor 110 is electrically connected to the first circuit node 104, and a source of the transistor 110 is electrically connected to the second circuit node 106. A first terminal of the capacitor 112 is electrically connected to the first circuit node 104, and hence, is electrically connected to the drain of the transistor 110. A second terminal of the capacitor 112 (opposite from the first terminal) is electrically connected to the gate of the transistor 110 and to a first terminal of the resistor 114 at a circuit node 108. A second terminal of the resistor 114 (opposite from the first terminal) is electrically connected to the second circuit node 106, and hence, is electrically connected to the source of the transistor 110. Accordingly, the effective capacitance ($C_{eff}$) of the capacitor 112 is electrically coupled between the gate and the drain of the transistor 110, and the effective resistance ($R_{eff}$) of the resistor 114 is electrically coupled between the gate and the source of the transistor 110.

A diode 116 is illustrated electrically connected or coupled between the first circuit node 104 and the second circuit node 106. The cathode of the diode 116 is electrically connected to the first circuit node 104, and hence, is electrically connected to the drain of the transistor 110 and the first terminal of the capacitor 112. The anode of the diode 116 is electrically connected to the second circuit node 106, and hence, is electrically connected to the source of the transistor 110 and the second terminal of the resistor 114. The diode 116 can be omitted in some examples.

The ESD protection circuit 100 is configured to discharge a flow of charge that results from an ESD event. In the absence of an ESD event, generally, no or a small amount of current flows through the resistor 114 such that the gate-to-source voltage of the transistor 110 is at or near 0 V (e.g., $v_{gs} \approx 0$ V). When the gate-to-source voltage is at or near 0 V, the transistor 110 is generally in an open state such that little to no current flows from the drain of the transistor 110 to the source of the transistor 110 (e.g., through the channel of the transistor 110). For example, in a direct current (DC) state in the absence of an ESD event, the voltage drop across the capacitor 112 is generally equal to the voltage drop between the first circuit node 104 and the second circuit node 106, which generally results in the capacitor 112 effectively functioning as an open circuit. This causes no current to flow through the resistor 114, which results in a 0 V voltage drop across the resistor 114, and further, a gate-to-source voltage of 0 V.

When an ESD event occurs at the first circuit node 104 or at some component electrically coupled to the first circuit node 104, the voltage on the first circuit node 104 can quickly spike (e.g., a high dV/dt stress). This change in voltage between the first circuit node 104 and the second circuit node 106 can cause a voltage drop across the resistor 114, which causes the gate-to-source voltage of the transistor 110 to result in the transistor 110 to be in a conducting state from the drain to the source of the transistor 110 (e.g., through the channel of the transistor 110). This conducting state can allow the flow of charge from the ESD event to be dissipated to the second circuit node 106, which may be an electrically grounded node. Furthermore, with the diode 116 when the ESD event occurs, the voltage between the first circuit node 104 and the second circuit node 106 can be in excess of the breakdown voltage of the diode 116, which can allow current to flow from the first circuit node 104 to the second circuit node 106 through the diode 116 to dissipate a flow of charge from the ESD event.

Although the various components in the gate-coupled transistor cell 102 in FIG. 1 are each illustrated as a singular component, each component may be one or more of the respective type of component electrically connected to achieve an effective characteristic. For example, the capacitor 112 may be one capacitor or multiple capacitors electrically connected in series and/or in parallel to achieve the effective capacitance ($C_{eff}$) represented by the capacitor 112. Similarly, the resistor 114 may be one resistor or multiple resistors, or one or multiple electrical paths having a respective resistance, electrically connected in series and/or in parallel to achieve the effective resistance ($R_{eff}$) represented by the resistor 114. Further, the transistor 110 may be one or multiple discrete transistors in, on, and/or over a semiconductor substrate electrically connected in parallel to achieve, for example, an effective width-to-length (W/L) ratio.

Figure 2A:
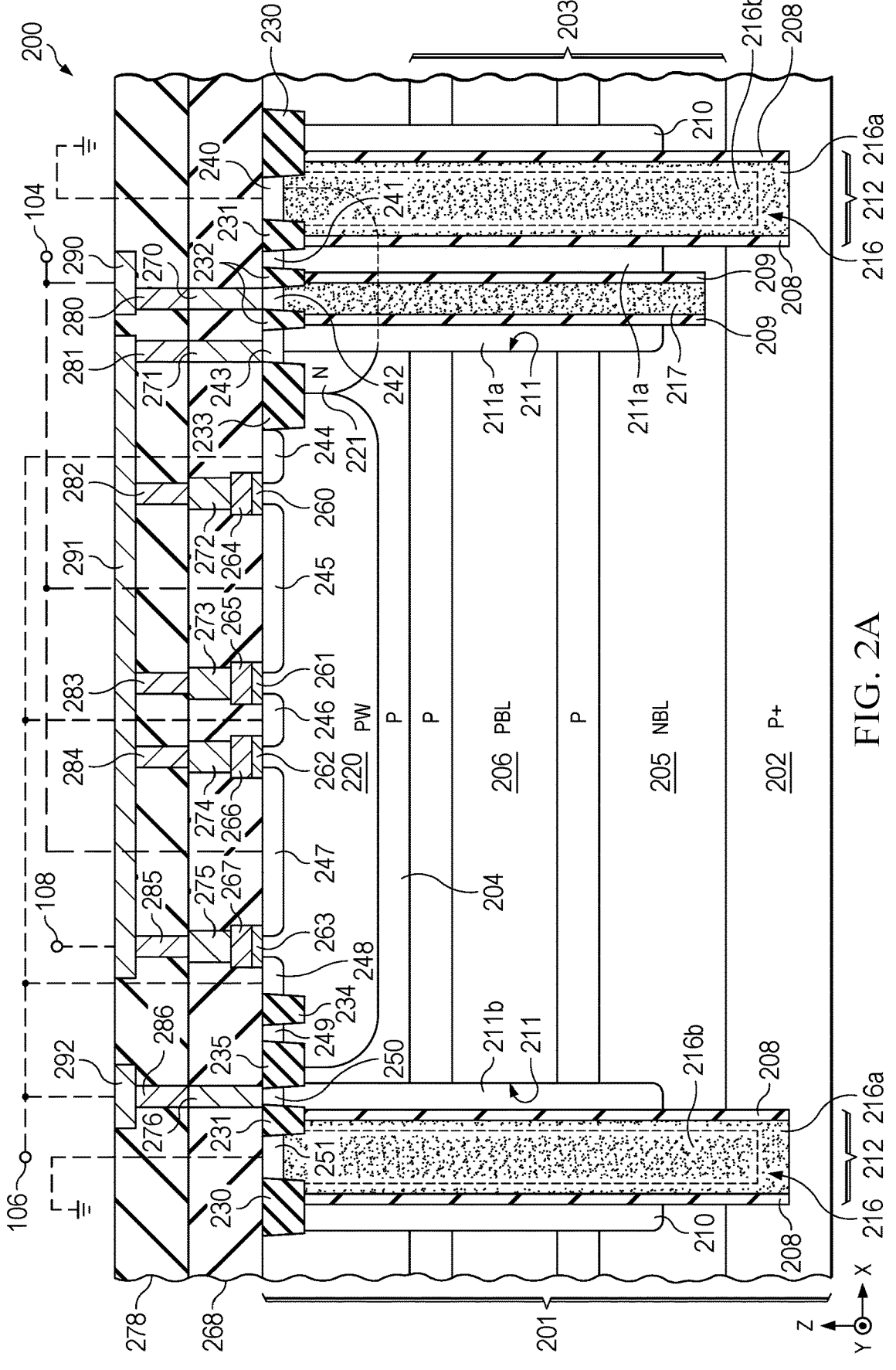
FIGS. 2A and 2B are a cross-sectional view and a layout view, respectively, of a gate-coupled transistor cell of an ESD protection circuit in an integrated circuit according to some examples.
Figure 2B:
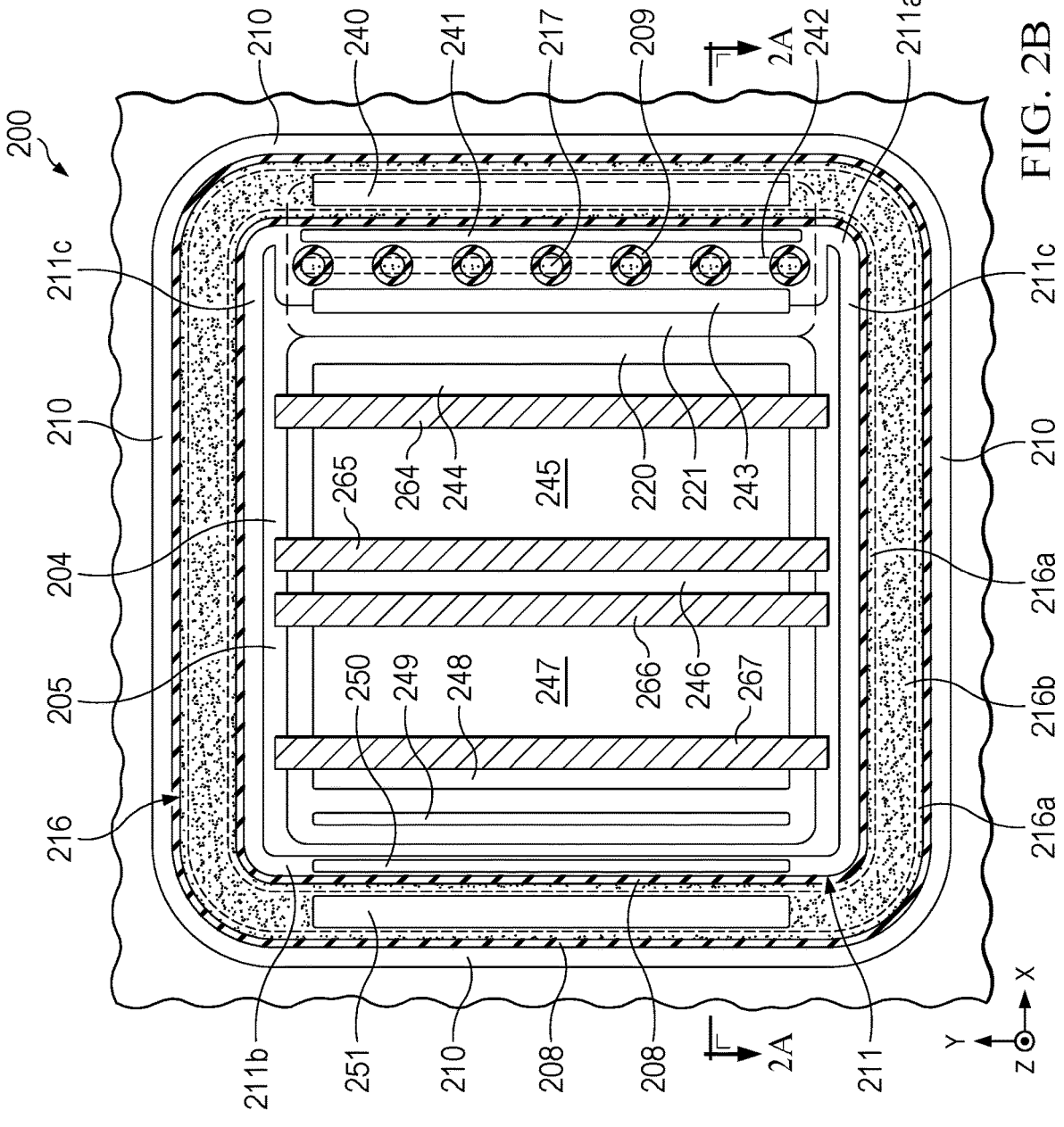

FIGS. 2A and 2B are a cross-sectional view and a layout view, respectively, of a gate-coupled transistor cell 200 of an ESD protection circuit in an integrated circuit according to some examples, and are described concurrently. FIG. 2B shows cross-section 2A-2A that is the cross-section illustrated in FIG. 2A. X-Y-Z reference axes are illustrated in the figures to facilitate orientations of views in those figures. Various aspects of the gate-coupled transistor cell 200 are described on the basis that a transistor of the gate-coupled transistor cell 200 is an n-type transistor, such that various doped layers and/or doped regions are described as being a given dopant conductivity type. The dopant conductivity type of various doped layers and/or doped regions may be changed or modified in other examples.

The gate-coupled transistor cell 200 includes a semiconductor substrate 201. The semiconductor substrate 201, in the illustrated example, includes a semiconductor support substrate 202 (or handle substrate or wafer), a first epitaxial layer 203, and a second epitaxial layer 204. The semiconductor support substrate 202 can be a bulk semiconductor substrate, a semiconductor-on-insulator (SOI) substrate, or any other appropriate substrate. The first epitaxial layer 203 is epitaxially grown on or over the semiconductor support substrate 202, and the second epitaxial layer 204 is epitaxially grown on or over the first epitaxial layer 203. The first epitaxial layer 203 and second epitaxial layer 204 can each be or include silicon (Si), silicon germanium (SiGe), gallium arsenide (GaAs), gallium nitride (GaN), the like, or a combination thereof. In some examples, the semiconductor support substrate 202 is or includes a silicon substrate (which may be singulated from a bulk silicon wafer at the conclusion of semiconductor processing), and each of the first epitaxial layer 203 and the second epitaxial layer 204 is or includes a layer of silicon. In some examples, the first epitaxial layer 203 and/or the second epitaxial layer 204 can be omitted, and a semiconductor material of the semiconductor substrate 201 (e.g., in, on, and/or over which devices are formed) can be or include silicon (Si), silicon germanium (SiGe), gallium arsenide (GaAs), the like, or a combination thereof. The semiconductor substrate 201 has a top major surface in and/or on which devices (e.g., transistors) are generally disposed and formed.

The first epitaxial layer 203 is doped with a dopant having a first conductivity type (e.g., p-type). In some examples, the first epitaxial layer 203 can be doped in situ during epitaxial growth with a p-type dopant (e.g., boron) at a concentration in a range from about $1 \times 10^{14}$ cm$^{-3}$ to about $5 \times 10^{15}$ cm$^{-3}$, e.g., lightly to moderately doped. Also, the second epitaxial layer 204 is doped with a dopant having the first conductivity type. In some examples, the second epitaxial layer 204 can be doped in situ during epitaxial growth with a p-type dopant (e.g., boron) at a concentration in a range from about $1 \times 10^{14}$ cm$^{-3}$ to about $5 \times 10^{15}$ cm$^{-3}$, e.g., lightly to moderately doped. In some examples the first and second epitaxial layers 203, 204 have about a same dopant concentration.

A deep buried layer 205 and a buried layer 206 are disposed in the semiconductor substrate 201 (e.g., in the first epitaxial layer 203). The deep buried layer 205 is disposed at a depth in the semiconductor substrate 201 that is greater than the depth in the semiconductor substrate 201 at which the buried layer 206 is disposed. As illustrated, the buried layer 206 is disposed above and over the deep buried layer 205 in the semiconductor substrate 201 (e.g., the semiconductor support substrate 202).

The deep buried layer 205 is doped with a dopant having a second conductivity type opposite the first conductivity type, and the buried layer 206 is doped with a dopant having the first conductivity type. In some examples, the deep buried layer 205 can be an n-type layer doped with an n-type dopant (e.g., phosphorous and/or arsenic) at a concentration in a range from about $1 \times 10^{13}$ cm$^{-3}$ to about $3 \times 10^{15}$ cm$^{-3}$, e.g., lightly to moderately doped, and the buried layer 206 can be a p-type layer doped with a p-type dopant at a concentration in a range from about $1 \times 10^{12}$ cm$^{-3}$ to about $5 \times 10^{13}$ cm$^{-3}$, e.g., lightly doped. Hence, in the illustrated example, the deep buried layer 205 is shown as an n-type buried layer (NBL), and the buried layer 206 is shown as a p-type buried layer (PBL).

As mentioned, in some examples, the first epitaxial layer 203 and/or the second epitaxial layer 204 may be omitted. In such examples, the deep buried layer 205 and buried layer 206 may be implanted at respective depths in the semiconductor substrate 201, and a well can be implanted in the semiconductor substrate 201 extending from a top major surface of the semiconductor substrate 201 to a depth to or above the buried layer 206. The well can be doped with a dopant at a concentration like described with respect to the first epitaxial layer 203.

A deep trench ring isolation structure 212 is disposed in the semiconductor substrate 201. The deep trench ring isolation structure 212 extends from the top major surface of the semiconductor substrate 201 to a depth in the semiconductor substrate 201 that is in or below the deep buried layer 205. The deep trench ring isolation structure 212 includes a dielectric layer 208 and a fill material 216. The deep trench ring isolation structure 212 is generally at or near the outer lateral boundary of the gate-coupled transistor cell 200. The deep trench ring isolation structure 212 generally has a rectangular ring shape with rounded corners in the layout view of FIG. 2B, although the deep trench ring isolation structure 212 may have another shape. Generally, functional components of the gate-coupled transistor cell 200 are disposed laterally interior to the deep trench ring isolation structure 212 in a region surrounded by the deep trench ring isolation structure 212.

The dielectric layer 208 of the deep trench ring isolation structure 212 is along sidewall surfaces of the deep trench ring isolation structure 212. The dielectric layer 208 may be or include any dielectric material, such as an oxide, a nitride, the like, or a combination thereof. The fill material 216 is interior to the dielectric layer 208 within the deep trench ring isolation structure 212. The fill material 216 can be any material, such as a semiconductor material, an insulator material, a conductive material, or any combination thereof. In the illustrated example, the fill material 216 includes an outer portion 216a and an inner portion 216b. The outer portion 216a is on and along the inner sidewall surfaces of the dielectric layer 208 and on and along a surface of the semiconductor substrate 201 (e.g., the semiconductor support substrate 202) that forms a bottom surface of the trench. The outer portion 216a, in some examples, is or includes a doped semiconductor material (e.g., doped polysilicon). The inner portion 216b is interior to the outer portion 216a and fills a remaining portion of the fill material 216. The inner portion 216b, in some examples, is or includes undoped semiconductor material (e.g., undoped polysilicon). In examples in which the outer portion 216a is a doped semiconductor material, such as doped polysilicon, the doped semiconductor material can be a material doped with a p-type dopant or an n-type dopant at a concentration in a range from about $1\times10^{14}$ cm$^{-3}$ to about $5\times10^{15}$ cm$^{-3}$, e.g., lightly to moderately doped.

One or more inner capacitor electrode structures 217 and respective one or more capacitor dielectric layers 209 are disposed in the semiconductor substrate 201. The layout view of FIG. 2B illustrates that the gate-coupled transistor cell 200 includes seven inner capacitor electrode structures 217, although in other examples, the gate-coupled transistor cell 200 may include any number of one or more inner capacitor electrode structures 217. Furthermore, each inner capacitor electrode structure 217 is shown to be generally circular in the layout view of FIG. 2B (e.g., generally cylindrical in three-dimensions), and may be referred to as an island structure. In other examples, each inner capacitor electrode structure 217 or any permutation of inner capacitor electrode structures 217 can have other and various shapes.

The inner capacitor electrode structures 217 and respective capacitor dielectric layers 209 extend from the top major surface of the semiconductor substrate 201 to a depth in the semiconductor substrate 201 that is in the deep buried layer 205. In some examples, the inner capacitor electrode structures 217 and respective capacitor dielectric layers 209 may extend from the top major surface of the semiconductor substrate 201 to a depth in the semiconductor substrate 201 that is below the deep buried layer 205. The inner capacitor electrode structures 217 and respective capacitor dielectric layers 209 are disposed laterally interior to the deep trench ring isolation structure 212.

The capacitor dielectric layer 209 of a respective inner capacitor electrode structure 217 is along sidewall surfaces of a recess disposed in the semiconductor substrate 201 (e.g., in the second epitaxial layer 204 and the first epitaxial layer 203). The capacitor dielectric layer 209 may be or include any dielectric material, such as an oxide, a nitride, the like, or a combination thereof. Each inner capacitor electrode structure 217 is interior to the respective capacitor dielectric layer 209 within the recess. The inner capacitor electrode structures 217 contact the respective bottom surfaces of the recesses in the semiconductor substrate 201. The inner capacitor electrode structure 217 includes a conductive material at least on and along the inner sidewall surfaces of the capacitor dielectric layer 209. In some examples, like illustrated, a conductive material (e.g., doped polysilicon) can form an entirety of the inner capacitor electrode structure 217. In other examples, like described with the deep trench ring isolation structure 212, the inner capacitor electrode structure 217 may include an outer portion and an inner portion, in which the outer portion is or includes a conductive material, like a doped semiconductor material (e.g., doped polysilicon), and the inner portion is or includes undoped semiconductor material (e.g., undoped polysilicon). In examples in which the conductive material of the inner capacitor electrode structure 217 is a doped semiconductor material, such as doped polysilicon, the doped semiconductor material can be a material doped with a p-type dopant or an n-type dopant at a concentration in a range from about $1\times10^{14}$ cm$^{-3}$ to about $5\times10^{15}$ cm$^{-3}$, e.g., lightly to moderately doped. In the illustrated example, the inner capacitor electrode structure 217 is doped with a p-type dopant.

Various doped regions are disposed along sidewalls of the deep trench ring isolation structure 212 and the capacitor dielectric layers 209. An outer doped ring 210 having the second conductivity type is disposed along laterally exterior sidewalls of the deep trench ring isolation structure 212. The outer doped ring 210 laterally encircles the deep trench ring isolation structure 212. An inner doped ring 211 having the second conductivity type is disposed along laterally interior sidewalls of the deep trench ring isolation structure 212. The inner doped ring 211 has the second conductivity type (e.g., n-type), and includes a first doped portion 211a, a second doped portion 211b, and laterally connecting doped portions 211c. The laterally connecting doped portions 211c extend laterally and continuously from the first doped portion 211a to the second doped portion 211b in the illustrated example of FIG. 2B. The laterally connecting doped portions 211c may be omitted in some examples.

The outer doped ring 210 and the inner doped ring 211 (including doped portions 211a-211c) extend to a depth in the semiconductor substrate 201 that is at least to the deep buried layer 205. In the illustrated example, the outer doped ring 210 and the inner doped ring 211 extend to a depth within (e.g., at a mid-thickness of) the deep buried layer 205. Hence, the first doped portion 211a and the second doped portion 211b (and the laterally connecting doped portions 211c, if present) of the inner doped ring 211 contact the deep buried layer 205 interior to the deep trench ring isolation structure 212. In some examples, the outer doped ring 210 and the inner doped ring 211 are n-type doped with a dopant concentration in a range from about $1\times10^{13}$ cm$^{-3}$ to about $8\times10^{15}$ cm$^{-3}$, e.g., lightly to moderately doped. In some examples, the outer doped ring 210 may be a dummy region. In some examples, the outer doped ring 210 may be omitted.

The first doped portion 211a is further disposed laterally at, around, and/or encircling the capacitor dielectric layer(s) 209 and the inner capacitor electrode structure(s) 217. The first doped portion 211a forms an outer capacitor electrode structure, and hereafter is generally referred to as the outer capacitor electrode structure 211a. The outer capacitor electrode structure 211a is disposed along and around or encircling each capacitor dielectric layer 209. Each inner capacitor electrode structure 217, respective capacitor dielectric layer 209, and the outer capacitor electrode structure 211a forms a respective capacitor having a capacitance. As detailed subsequently, the inner capacitor electrode structures 217 can be electrically connected together at a same node such that the capacitors that are formed are electrically connected together in parallel, which produces an effective capacitance $C_{eff}$ as represented by the capacitor 112 in FIG. 1. As indicated previously, any number of capacitors may be formed, and may be implemented by different structures otherwise consistent with the description.

A resistive electrical current path is provided between the outer capacitor electrode structure 211a and the second doped portion 211b through the deep buried layer 205. A parallel resistive current path between the outer capacitor electrode structure 211a and the second doped portion 211b is provided through the laterally connecting doped portions 211c when present. The resistance of a given electrical current path may generally be a function of the doping in the path (e.g., which can determine a resistivity of the path), as well as geometries of the path (e.g., length of the path and cross-sectional area of the path). The resistances of these electrical current paths produce an effective resistance $R_{eff}$ as represented by the resistor 114 in FIG. 1. As indicated previously, any number of electrical current paths with various resistances may be formed, and may be implemented by otherwise consistent with the description.

Accordingly, a resistance-capacitance network is formed in the semiconductor substrate 201. The effective capacitance $C_{eff}$ is generally in series with the effective resistance $R_{eff}$. As described subsequently, a node between the effective capacitance and the effective resistance (e.g., circuit node 108 between the capacitor 112 and the resistor 114 in FIG. 1) is electrically connected to gate electrode structures 264, 265, 266, 267, described below and exemplified by the gate of transistor 110 in FIG. 1. However, due to the high impedance input of gate electrode structures, negligible current flows from that node to the gate electrode structures.

Dielectric isolation regions 230, 231, 232, 233, 234, 235 are disposed at the top major surface of the semiconductor substrate 201 and extend into the semiconductor substrate 201 (e.g., in the second epitaxial layer 204, as illustrated). The dielectric isolation regions 230-235 can be or include any appropriate dielectric or isolation material. In some examples, the dielectric isolation regions 230-235 are shallow trench isolation (STI) structures, though in some examples the dielectric isolation regions 230-235 can be other dielectric isolation regions such as field oxide regions (e.g., LOCOS).

The dielectric isolation region 230 extends laterally outwardly from in the deep trench ring isolation structure 212 (e.g., in the fill material 216) to beyond the outward lateral boundaries of the outer doped ring 210. The dielectric isolation region 231 extends laterally inwardly interior to the deep trench ring isolation structure 212 from in the deep trench ring isolation structure 212 (e.g., in the fill material 216) into the inner doped ring 211 (e.g., doped portions 211a-211c). The dielectric isolation region 232 extends laterally outwardly from the inner capacitor electrode structure 217 into the outer capacitor electrode structure 211a and generally laterally encircles the respective inner capacitor electrode structure 217. In some examples, one dielectric isolation region 232 may laterally encircle the multiple inner capacitor electrode structures 217. In other examples, one dielectric isolation region 232 may laterally encircle a respective one inner capacitor electrode structure 217, such that the gate-coupled transistor cell 200 includes multiple dielectric isolation regions 232. Lateral positioning of the dielectric isolation regions 233, 234, 235 will be described in the context of other components subsequently.

A first well 220 having the first conductivity type (e.g., p-type) is disposed in the semiconductor substrate 201 (e.g., in the second epitaxial layer 204, as illustrated) in the region surrounded by the deep trench ring isolation structure 212. The dielectric isolation region 235 extends laterally from the second doped portion 211b into the first well 220. In some examples, the first well 220 is doped with a p-type dopant (e.g., boron) at a concentration in a range from about $1\times10^{12}$ cm$^{-3}$ to about $5\times10^{13}$ cm$^{-3}$, e.g., lightly to moderately doped. Hence, in the illustrated example, the first well is shown to be a p-type well (PW).

A second well 221 having the second conductivity type (e.g., n-type) is disposed in the semiconductor substrate 201 (e.g., in the second epitaxial layer 204, as illustrated). The second well 221 is disposed generally interior to the deep trench ring isolation structure 212. The second well 221 extends laterally from at or near the first well 220 to the outer capacitor electrode structure 211a. Portions of the second well 221 that would otherwise overlap the deep trench ring isolation structure 212 are subsumed by the fill material 216 and the inner capacitor electrode structures 217. Thus the dashed portion of the second well shown in FIG. 2A represent the boundary of the well outside the plane of the figure. The dielectric isolation region 233 is disposed extending laterally from the within the first well 220 into the second well 221. In some examples, the second well 221 is doped with an n-type dopant (e.g., phosphorus) at a concentration in a range from about $1\times10^{12}$ cm$^{-3}$ to about $1\times10^{13}$ cm$^{-3}$, e.g., lightly doped.

Gate structures are disposed on or over the semiconductor substrate 201 within the region surrounded by the deep trench ring isolation structure 212. The gate structures are disposed on or over the first well 220. Each gate structure includes a respective gate dielectric layer 260, 261, 262, 263 disposed on or over the semiconductor substrate 201, and respective gate electrode structure 264, 265, 266, 267 disposed on or over the respective gate dielectric layers 260-263. The gate dielectric layers 260-263 can be or include any appropriate dielectric material, such as an oxide, nitride, the like, or a combination thereof. The gate electrode structures 264-267 can be or include any appropriate conductive material, such as polysilicon (e.g., doped polysilicon), metal (e.g., tungsten (W), aluminum (Al), titanium (Ti), tantalum (Ta), or the like), a semiconductor-metal compound (e.g., silicide), the like, or a combination thereof. Features or aspects of the gate structures other than those shown may be implemented. As described below the gate structures shown are electrically connected in parallel to achieve one effective transistor. While four gate structures are illustrated in the current example any number of discrete transistors may be implemented in other examples.

Source regions 244, 246, 248 and drain regions 245, 247 are disposed in the first well 220. The source region 244 extends laterally between the dielectric isolation region 233 and the gate electrode structure 264. The drain region 245 extends laterally between the gate electrode structure 264 and the gate electrode structure 265. The source region 246 extends laterally between the gate electrode structure 265 and the gate electrode structure 266. The drain region 247 extends laterally between the gate electrode structure 266 and the gate electrode structure 267. The source region 248 extends laterally between the gate electrode structure 267 and the dielectric isolation region 234.

The source region 244, drain region 245, gate dielectric layer 260, and gate electrode structure 264 form a first discrete transistor. The source region 246, drain region 245, gate dielectric layer 261, and gate electrode structure 265 form a second discrete transistor. The source region 246, drain region 247, gate dielectric layer 262, and gate electrode structure 266 form a third discrete transistor. The source region 248, drain region 247, gate dielectric layer 263, and gate electrode structure 267 form a fourth discrete transistor.

The source regions 244, 246, 248 and drain regions 245, 247 are doped with a dopant having the second conductivity type (e.g., n-type). In some examples, the source regions 244, 246, 248 and drain regions 245, 247 are doped with an n-type dopant (e.g., phosphorous) at a concentration in a range from about $1\times10^{13}$ cm$^{-3}$ to about $2\times10^{15}$ cm$^{-3}$, e.g., lightly to moderately doped.

A backgate contact 249 having the first conductivity type (e.g., p-type) is disposed in the first well 220 between the dielectric isolation regions 234 and 235. In some examples, the backgate contact 249 is doped with boron at a concentration in a range from about $1\times10^{13}$ cm$^{-3}$ to about $2\times10^{15}$ cm$^{-3}$, e.g., lightly to moderately doped.

A first outer capacitor electrode contact 241 and a second outer capacitor electrode contact 243 having the second conductivity type contact the outer capacitor electrode structure 211a. The first outer capacitor electrode contact 241 extends laterally between the dielectric isolation region 231 and the dielectric isolation region 232, and the second outer capacitor electrode contact 243 extends laterally between the dielectric isolation region 232 and the dielectric isolation region 233. In the illustrated example, the outer capacitor electrode contacts 241, 243 are illustrated as separate regions. In some other examples, the outer capacitor electrode contacts 241, 243 may directly connect, or be contiguous, e.g., by forming a closed loop around the inner capacitor electrode structures 217. The outer capacitor electrode contacts 241, 243 are doped, e.g., with phosphorous, to a greater dopant concentration than the second well 221 and the outer capacitor electrode structure 211a, e.g., in a range from about $1\times10^{13}$ cm$^{-3}$ to about $2\times10^{15}$ cm$^{-3}$, e.g., lightly to moderately doped.

An inner capacitor electrode contact 242 may be formed over the inner capacitor electrode structure 217 as illustrated in FIG. 2A. More generally, an instance of the inner capacitor electrode contact 242 may be formed over each of the inner capacitor electrode structures 217 shown in FIG. 2B. The inner capacitor electrode contact 242 may be a doped semiconductor region in examples for which the inner capacitor electrode structure 217 includes a semiconductor material such as doped polysilicon. For each inner capacitor electrode structure 217, the inner capacitor electrode contact 242 is disposed laterally internal to the dielectric isolation region 232. The inner capacitor electrode contact 242 is doped with a dopant having a same conductivity type as the inner capacitor electrode structure 217. Further, the inner capacitor electrode contact 242 is doped to a dopant concentration that is greater than the dopant concentration of the second well 221 and the inner capacitor electrode structure 217. In the present example, for which the inner capacitor electrode structure 217 is p-type, the inner capacitor electrode contact(s) 242 can be doped with a p-type dopant (e.g., boron) to a concentration in a range from about $1\times10^{13}$ cm$^{-3}$ to about $2\times10^{15}$ cm$^{-3}$, e.g., lightly to moderately doped. In the illustrated example, the inner capacitor electrode structures 217 shown in FIG. 2B are connected in parallel by metal interconnect structures to operate electrically as a single capacitor.

A contact region 250 having the second conductivity type is disposed on the second doped portion 211b. The contact region 250 extends laterally between the dielectric isolation region 235 and the dielectric isolation region 231. In some examples, the contact region 250 is doped with an n-type dopant (e.g., phosphorous) at a concentration in a range from about $1\times10^{13}$ cm$^{-3}$ to about $2\times10^{15}$ cm$^{-3}$, e.g., lightly to moderately doped.

In examples where the fill material 216 is or includes a doped semiconductor material, such as doped polysilicon, substrate contact regions 240, 251 are disposed in the fill material 216. The substrate contact regions 240, 251 are disposed laterally between the dielectric isolation region 230 and the dielectric isolation region 231. The substrate contact regions 240, 251 are doped with a dopant having the same conductivity type as the dopant with which the fill material 216 (e.g., the outer portion 216a) is doped. In examples for which the fill material 216 is n-type, the substrate contact regions 240, 251 can be doped with an n-type dopant (e.g., phosphorus) to a concentration in a range from about $1\times10^{13}$ cm$^{-3}$ to about $2\times10^{15}$ cm$^{-3}$, e.g., lightly to moderately doped.

A first dielectric layer 268 is disposed on or over the semiconductor substrate 201 and the gate structures, and is referred to hereinafter as pre-metal dielectric (PMD) layer 268. More specifically, the PMD layer 268 is disposed on or over the dielectric isolation regions 230-235 and doped regions 240-251 disposed in the semiconductor substrate 201, and on or over the gate electrode structures 264-267 and gate dielectric layers 260-263 disposed on or over the semiconductor substrate 201. The PMD layer 268 can include multiple dielectric layers of same or different dielectric materials. For example, the PMD layer 268 may primarily include a silicon-oxide based material such as a phosphosilicate glass (PSG), and may further include one or more etch stop layers such as silicon nitride (SiN) or the like, e.g., to prevent silicide formation in some locations over the semiconductor substrate 201.

Metal contacts 270, 271, 272, 273, 274, 275, 276 are disposed through the PMD layer 268 and contact a respective doped region 240-251 or gate electrode structure 264-267. The contact 270 contacts the inner capacitor electrode contact 242. The contact 271 contacts the second outer capacitor electrode contact 243. The contact 272 contacts the gate electrode structure 264. The contact 273 contacts the gate electrode structure 265. The contact 274 contacts the gate electrode structure 266. The contact 275 contacts the gate electrode structure 267. The contact 276 contacts the contact region 250. Although not specifically illustrated, respective other contacts are also disposed through the PMD layer 268 and contact the source regions 244, 246, 248 and drain regions 245, 247.

Each of the contacts 270-276 can include a semiconductor-metal compound (e.g., silicide) at the surface of the respective semiconductor doped region 240-251 or gate electrode structure 264-267, one or more barrier and/or adhesion layers (e.g., titanium nitride (TiN), tantalum nitride (TaN), the like, or a combination thereof) conformally in a respective opening through the PMD layer 268, and a conductive fill material (e.g., a metal, such as tungsten (W), copper (Cu), a combination thereof, or the like).

A second dielectric layer 278 is disposed on or over the PMD layer 268, and is referred to hereinafter as inter-metal dielectric (IMD) layer 278. The IMD layer 278 can include multiple dielectric layers of same or different dielectric materials. For example, the IMD layer 278 may primarily include a silicon-oxide based material such as a plasma-deposited oxide, and may further include one or more etch stop layers such as silicon nitride (SiN) or the like.

Metal vias 280, 281, 282, 283, 284, 285, 286 and metal lines 290, 291, 292 are disposed in the IMD layer 278. The metal via 280 extends from the metal line 290 and electrically connects to the contact 270. The metal vias 281-285 extend from the metal line 291. The metal via 281 electrically connects to the contact 271. The metal via 282 electrically connects to the contact 272. The metal via 283 electrically connects to the contact 273. The metal via 284 electrically connects to the contact 274. The metal via 285 electrically connects to the contact 275. And the metal via 286 extends from the metal line 292 and electrically connects to the contact 276.

Although not specifically illustrated, other metal vias and other metal lines are disposed in the IMD layer 278. For example, metal vias electrically connected to a same first circuit node as the metal line 290 electrically connect to the drain regions 245, 247. This circuit node forms, at least in part, the first circuit node 104 of FIG. 1 (as illustrated by dashed line electrical connections in FIG. 2A). Metal vias electrically connected to a same second circuit node as the metal line 292 electrically connect to the source regions 244, 246, 248. The second circuit node forms, at least in part, the second circuit node 106 of FIG. 1 (as illustrated by dashed line electrical connections in FIG. 2A). The circuit node including the gate electrode structures 264-267, the second outer capacitor electrode contact 243 and the metal line 291 form, at least in part, the circuit node 108 of FIG. 1. Additionally, as illustrated by dashed line electrical connections in FIG. 2A, contacts, metal vias, and/or metal lines electrically connect the substrate contact regions 240, 251 to an electrical ground node.

The metal lines 290-292, other metal lines, metal vias 280-286, and/or other metal vias can include one or more barrier and/or adhesion layers (e.g., titanium nitride (TiN), tantalum nitride (TaN), the like, or a combination thereof) conformally in a respective opening through the IMD layer 278, and can include a conductive fill material (e.g., a metal, such as tungsten (W), copper (Cu), a combination thereof, or the like).

With (i) the source regions 244, 246, 248 electrically connected together by contacts, metal vias, and metal line(s), (ii) the drain regions 245, 247 electrically connected together by contacts, metal vias, and metal line(s), and (iii) by the gate electrode structures 264-267 electrically connected together at the circuit node 108 by contacts 272-275, metal vias 282-285, and metal line 291, one effective transistor is formed from multiple (e.g., four illustrated) discrete transistors in the gate-coupled transistor cell 200. Additionally, with the second outer capacitor electrode contact 243 electrically connected to the gate electrode structures 264-267 by the contacts 271-275, metal vias 281-285, and metal line 291, the gate electrode structures 264-267 are electrically connected to the resistance-capacitance network (e.g., to the second outer capacitor electrode contact 243 electrically coupled between the effective capacitance and the effective resistance) described above and as illustrated in FIG. 1.

The contacts, metal lines, and metal vias are illustrated and described in a simplified manner for ease of illustration. Various contacts, metal lines, and/or metal vias can take any configuration and can be disposed in any dielectric layer at any metal layer over the semiconductor substrate 201 to implement electrical connections or couplings described herein.

As described above, the effective resistance in the resistance-capacitance network of the gate-coupled transistor cell 200 is formed at least in part by a resistance of an electrical current path through the deep buried layer 205. The deep buried layer 205 is disposed underlying other component(s) of the gate-coupled transistor cell 200, such as the source regions 244, 246, 248, drain regions 245, 247, and gate structures that form the effective transistor. By having the resistance of the electrical current path through the deep buried layer 205 underlying the effective transistor, a footprint or area of the gate-coupled transistor cell 200 can be reduced relative to the resistance of the cell being only laterally offset from the effective transistor, e.g., in a dedicated well or polysilicon resistor. Additionally, the effective capacitance is formed by one or more capacitors that extend vertically (e.g., perpendicular to a lateral direction) in the semiconductor substrate 201. By extending the capacitor(s) vertically in the semiconductor substrate, the footprint or area of the gate-coupled transistor cell 200 can be further reduced. The footprint or area of the gate-coupled transistor cell 200 can be 20% or more less than a similar circuit cell having a metal-oxide-semiconductor or metal capacitor and a dedicated well or polysilicon resistor.

In the illustrated example, when the conductivity type of the inner capacitor electrode structure 217 and the deep buried layer 205 are different, the inner capacitor electrode structure 217 forms a p-n junction with the deep buried layer 205 at the bottom of the respective recess in which the inner capacitor electrode structure 217 is disposed. In normal operation, the p-n junction is reversed biased, which may be modeled as a part of the effective capacitance. While in an ESD event a breakdown voltage of the p-n junction may be surpassed permitting some current to flow through the p-n junction, it is expected that such current flow may be relatively small and will not significantly interfere with the performance of the ESD protection circuit 100.

Figure 3:
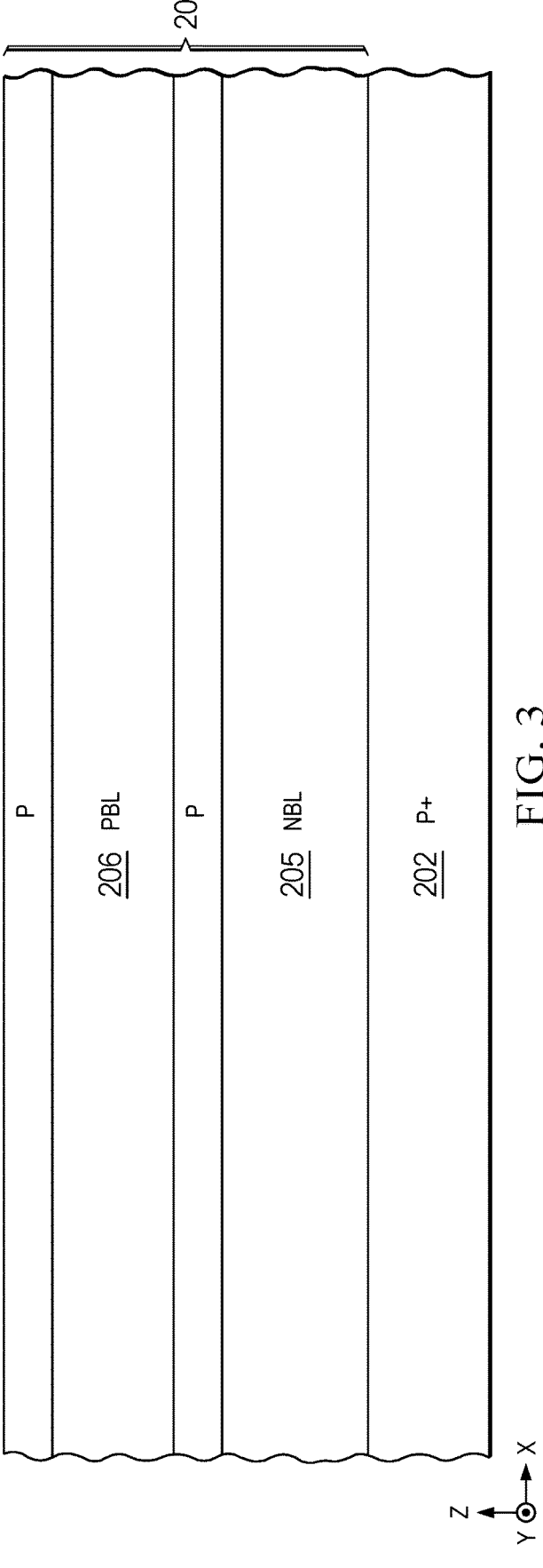
FIGS. 3 through 15 illustrate cross-sectional views of the gate-coupled transistor cell of FIGS. 2A and 2B at various stages of manufacturing according to an example method.

Turning now to FIGS. 3 through 15, the gate-coupled transistor cell 200 is illustrated in cross-sectional views taken at the at the cut line 2A-2A at various stages of manufacturing according to an example method. Referring to FIG. 3, a first epitaxial layer 203 has been formed on or over the semiconductor support substrate 202, and a deep buried layer 205 and a buried layer 206 are formed in the first epitaxial layer 203. In an example, the semiconductor support substrate 202 is a bulk silicon wafer. The first epitaxial layer 203 can be formed using an epitaxial growth by an appropriate epitaxial growth process, such as low pressure chemical vapor deposition (LPCVD) or the like. In an example, the first epitaxial layer 203 is silicon. The first epitaxial layer 203 is doped, such as by in situ during the epitaxial growth. The dopant type and concentration of the dopant in the first epitaxial layer 203 are as described above. The deep buried layer 205 and the buried layer 206 can be formed by implanting respective dopants into the first epitaxial layer 203. The dopant type and concentration of the deep buried layer 205 and the buried layer 206 are as described above.

Figure 4:
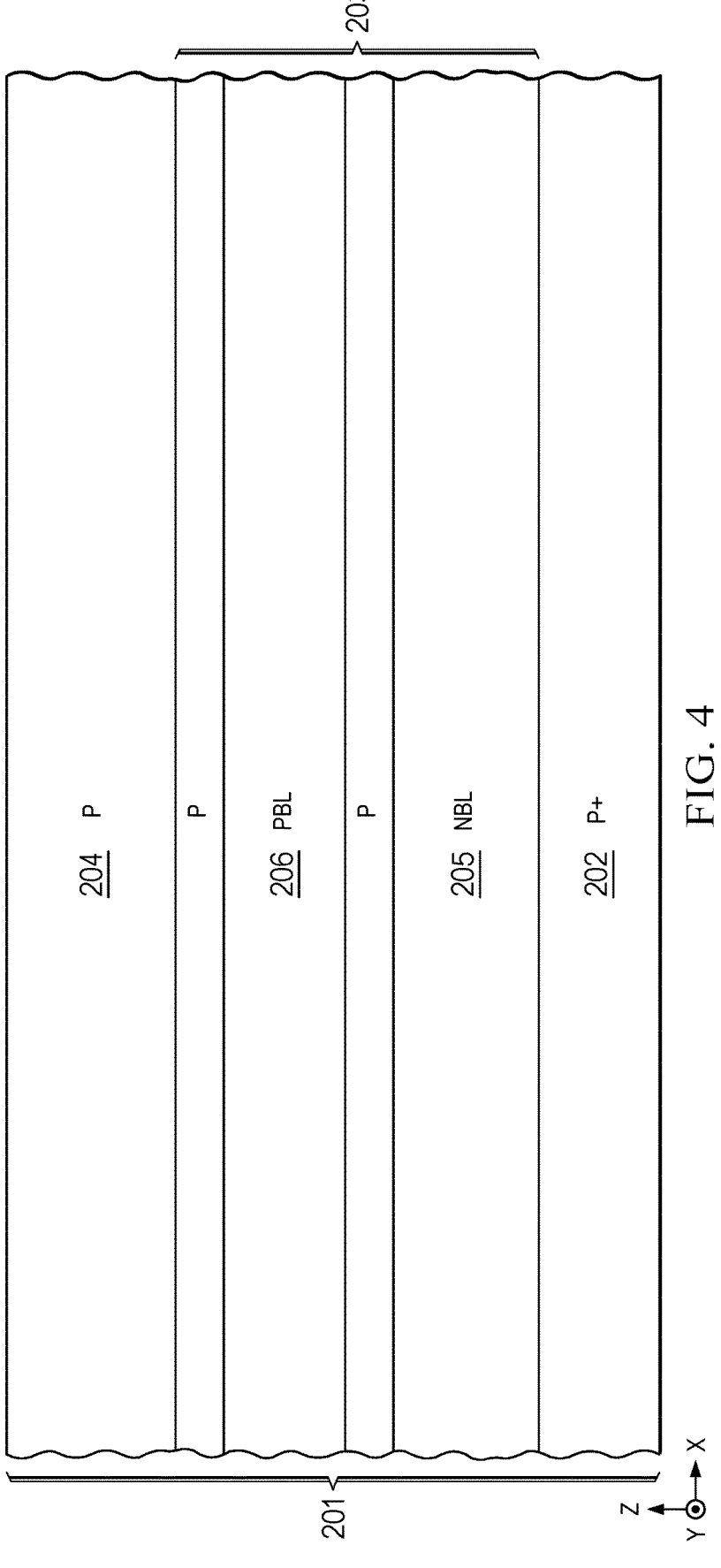

Referring to FIG. 4, a second epitaxial layer 204 is formed on or over the first epitaxial layer 203. The second epitaxial layer 204 can be formed using an epitaxial growth by an appropriate epitaxial growth process, such as LPCVD or the like. In an example, the second epitaxial layer 204 is silicon. The second epitaxial layer 204 is doped, such as by in situ during the epitaxial growth. The dopant type and concentration of the dopant in the second epitaxial layer 204 are as described above.

In the illustrated example, the semiconductor support substrate 202, the first epitaxial layer 203, and the second epitaxial layer 204 form a semiconductor substrate 201. In other examples, another semiconductor substrate can be used. For example, the semiconductor substrate 201 can be a bulk silicon wafer (e.g., without the first epitaxial layer 203 and/or the second epitaxial layer 204) with a deep buried layer 205, buried layer 206, and doped well (e.g., doped like the first epitaxial layer 203 and the second epitaxial layer 204) implanted to respective depths in the semiconductor substrate 201.

Figure 5:
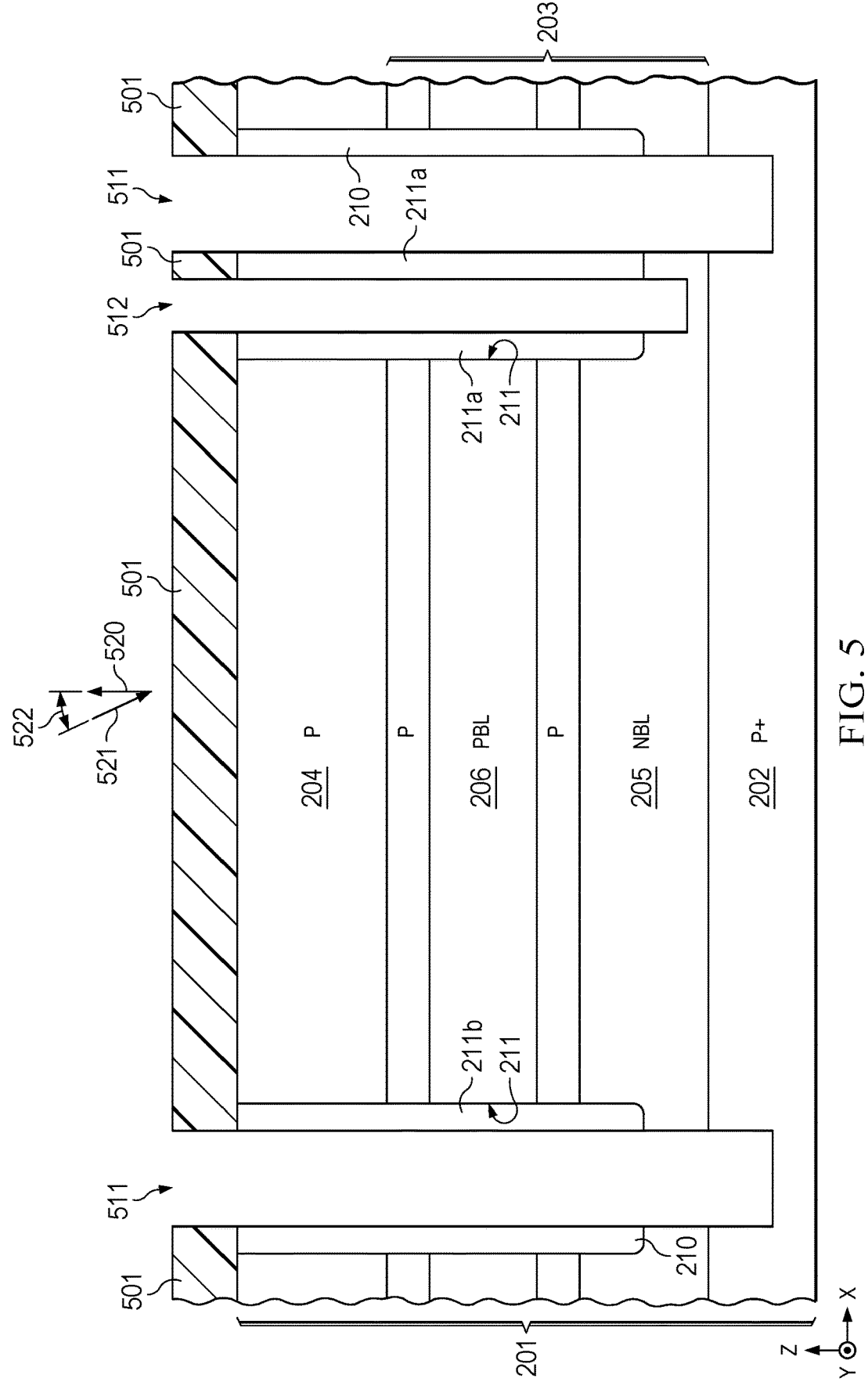

Referring to FIG. 5, a mask 501 is formed on or over the semiconductor substrate 201, and using the mask 501 a deep ring trench 511 and a capacitor recess 512 is etched in the semiconductor substrate 201. In some examples, the mask 501 is or includes a photoresist. To form the photoresist, the photoresist is deposited (e.g., by spin-on) on or over the semiconductor substrate 201 and patterned using photolithography. The photoresist is patterned to have openings corresponding to areas where the deep ring trench 511 and the capacitor recess 512 are to be formed. With the patterned photoresist, an anisotropic etch, such as a reactive ion etch (RIE), is performed to form the deep ring trench 511 and capacitor recess 512 in the semiconductor substrate 201. In the illustrated example, due to the lateral sizes of the deep ring trench 511 and capacitor recess 512 to be formed, a loading effect may be observed from the etch process, such that respective depth of the capacitor recess 512 is less than a depth of the deep ring trench 511. In other examples, the depth of the capacitor recess 512 may be equal to the depth of the deep ring trench 511, such as when no loading effect is observed and/or different etch processes are utilized for forming the deep ring trench 511 and the capacitor recess 512.

With the deep ring trench 511 and capacitor recess 512 formed and the mask 501 (e.g., photoresist) still disposed on the semiconductor substrate 201, sidewalls of the deep ring trench 511 and capacitor recess 512 are implanted with dopants to form the outer doped ring 210 and the inner doped ring 211 (including the doped portions 211a-211c). As an example, a tilt implant can be used to implant the sidewalls of the deep ring trench 511 and capacitor recess 512 with dopants. In an example, the semiconductor substrate 201 is disposed in an implant tool. The semiconductor substrate 201 is oriented in the implant tool such that a z-axis 520 is orthogonal to the top major surface of the semiconductor substrate 201 (e.g., the top major surface is in an x-y plane with reference to the X-Y-Z notation of the figures). The implant tool is configured to perform an implant 521 in an x-z plane at an angle 522 from the z-axis 520. In some examples, the angle 522 can be 14°, although different geometries of the deep ring trench 511, capacitor recess 512, outer doped ring 210, and/or inner doped ring 211 and/or different concentrations to which the outer doped ring 210 and inner doped ring 211 are to be doped may cause a different angle to be implemented. The implant 521 is performed on the semiconductor substrate 201 (with the mask 501 thereon), and the semiconductor substrate 201 is subsequently rotated around the z-axis 520 by 90°. Another implant 521 is performed on the semiconductor substrate 201, and the semiconductor substrate 201 is again subsequently rotated around the z-axis 520 by 90°. Thereafter, another implant 521, followed by a rotation, and followed by another implant 521 are performed. After the implant to form the outer doped ring 210 and the inner doped ring 211, the mask 501 (e.g., photoresist) is removed, such as by ashing.

Figure 6:
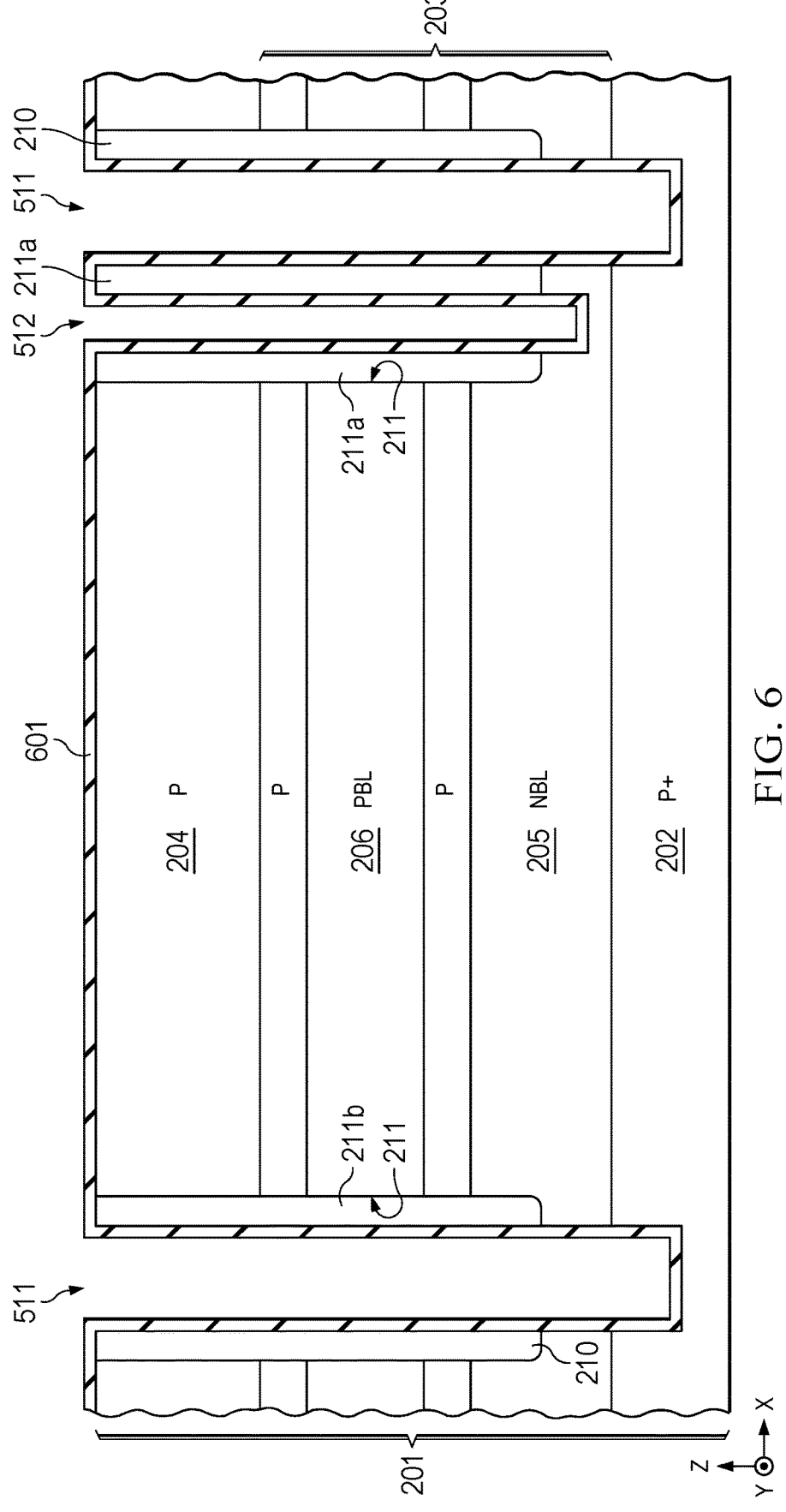

With reference to FIG. 6, a dielectric layer 601 is formed conformally on or over the semiconductor substrate 201. The dielectric layer 601 is formed conformally in the deep ring trench 511 and capacitor recess 512 (e.g., along sidewall surfaces and a bottom surface of the respective deep ring trench 511 or capacitor recess 512). The dielectric layer 208 and capacitor dielectric layers 209 are formed from and are respective portions of the dielectric layer 601. The dielectric layer 601 can be formed using an oxidation process, chemical vapor deposition (CVD) (e.g., plasma enhanced CVD (PECVD)), atomic layer deposition (ALD), or another deposition process.

Figure 7:
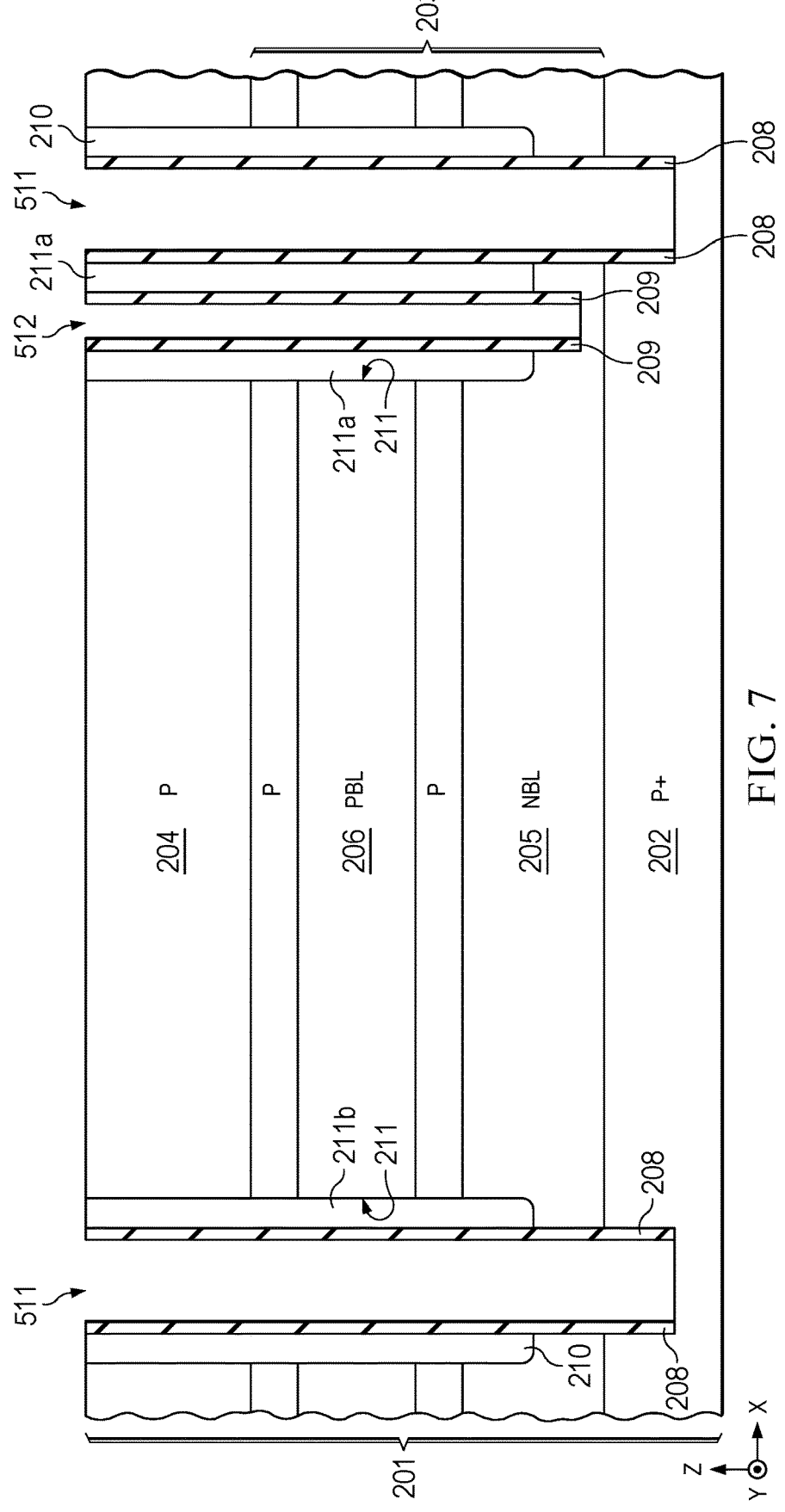

Referring to FIG. 7, the dielectric layer 601 is anisotropically etched to remove substantially horizontal portions of the dielectric layer 601. The dielectric layer 208 and capacitor dielectric layers 209 disposed along sidewall surfaces of the deep ring trench 511 and capacitor recess 512 remain after the anisotropic etch. The bottom surfaces of the deep ring trench 511 and capacitor recess 512 are exposed due to the anisotropic etch. The anisotropic etch may be an RIE, in some examples.

Figure 8:
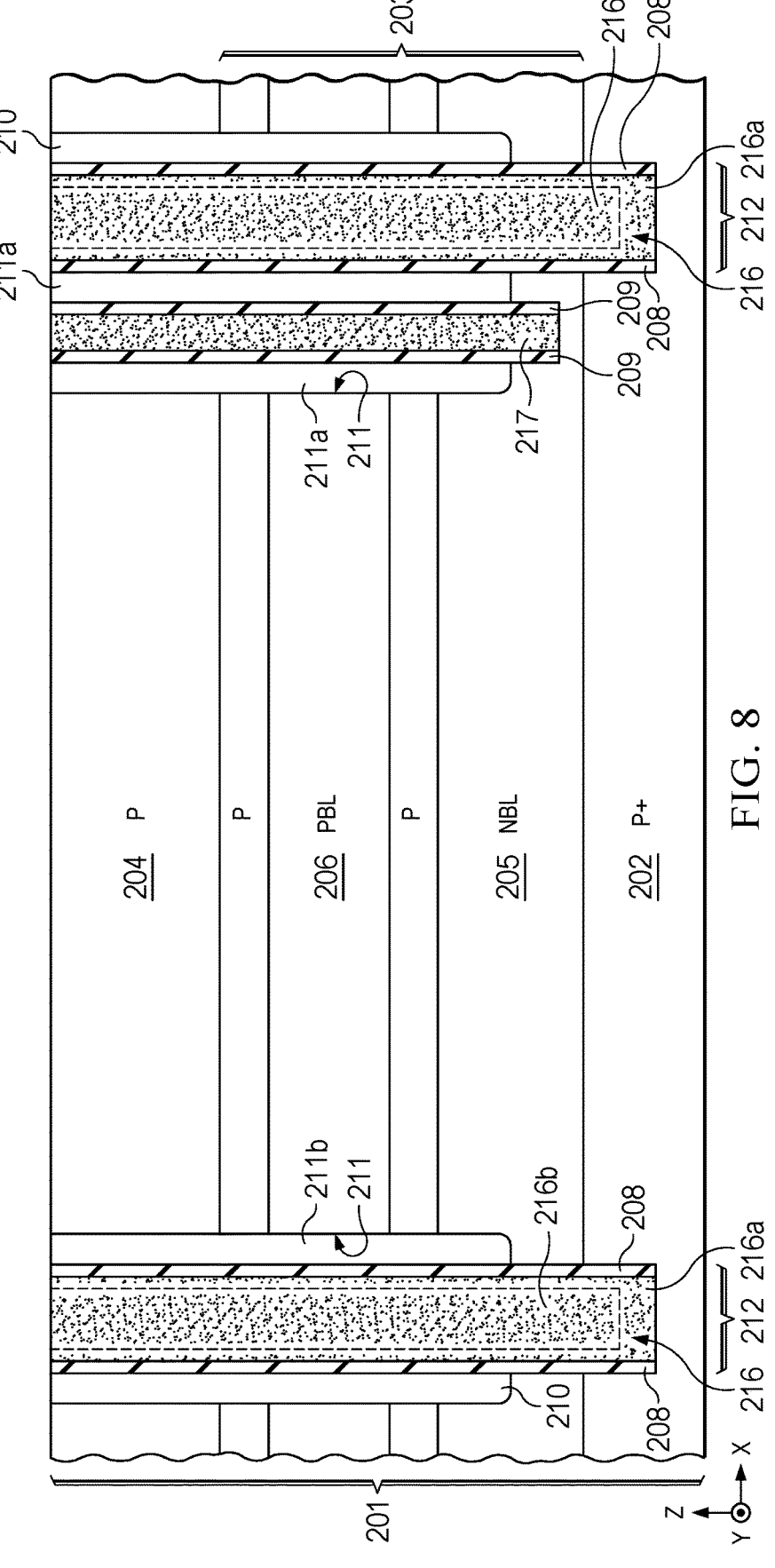

Referring to FIG. 8, the fill material 216 is formed in the deep ring trench 511 on the dielectric layer 208, and inner capacitor electrode structures 217 are formed in the capacitor recess 512 on the capacitor dielectric layers 209. As an example, a doped semiconductor material (e.g., doped polysilicon) is first deposited in the deep ring trench 511 and capacitor recess 512 and on the top major surface of the semiconductor substrate 201, and undoped semiconductor material (e.g., undoped polysilicon) is deposited on the doped semiconductor material. The undoped semiconductor material may fill any portion of the deep ring trench 511 and/or capacitor recess 512 that was unfilled by the doped semiconductor material. In some examples, as is illustrated, the doped semiconductor material may fill the capacitor recess 512, while the doped semiconductor material with the undoped silicon thereon may fill the deep ring trench 511. For example, if the respective widths of the capacitor recess 512 are less than the width of the deep ring trench 511, the doped semiconductor material may coalesce by deposition on sidewalls in the capacitor recess 512, thereby filling the capacitor recess 512, before the doped semiconductor material coalesces in the deep ring trench 511. Hence, the undoped semiconductor material may be thereafter deposited to fill the deep ring trench 511 in regions where the doped semiconductor material did not coalesce. In some examples, the doped semiconductor material does not fill the capacitor recess 512 and the deep ring trench 511, and the doped semiconductor material with the undoped silicon thereon fills each of the deep ring trench 511 and capacitor recess 512. For example, the doped semiconductor material may not coalesce by deposition on sidewalls in the deep ring trench 511 and in the capacitor recess 512, and the undoped semiconductor material may be thereafter deposited to fill the deep ring trench 511 and capacitor recess 512. The deposition of the doped semiconductor material and undoped semiconductor material can be by using CVD (e.g., PECVD), ALD, physical vapor deposition (PVD), the like, or a combination thereof.

After deposition of the undoped semiconductor material, a chemical mechanical polish (CMP) is performed to remove excess undoped semiconductor material and doped semiconductor material from on or over the top major surface of the semiconductor substrate 201. Respective remaining portions of the doped semiconductor material form the outer portion 216a in the deep trench ring isolation structure 212 and the inner capacitor electrode structures 217. A remaining portion of the undoped semiconductor material forms the inner portion 216b in the deep trench ring isolation structure 212. As noted previously, the fill material 216 and the inner capacitor electrode structures 217 can be or include other materials, which can be formed by the same or different processes.

Figure 9:
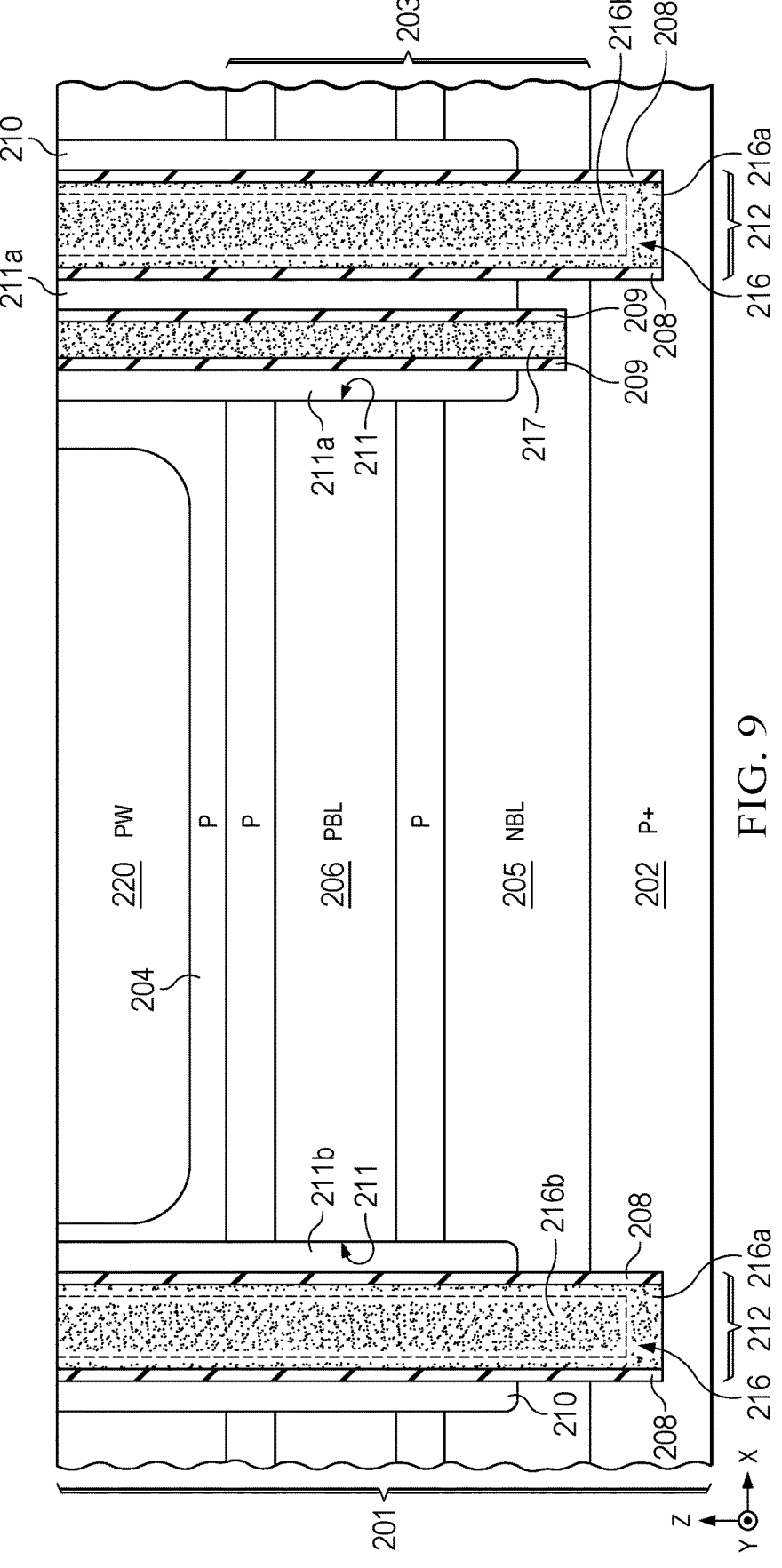

Referring to FIG. 9, the first well 220 is formed in the semiconductor substrate 201. To form the first well 220, a photoresist can be deposited (e.g., by spin-on) on or over the semiconductor substrate 201 and patterned using photolithography. The photoresist is patterned to have an opening corresponding to an area where the first well 220 is to be formed. With the patterned photoresist, an implant is performed to implant dopants into the semiconductor substrate 201 thereby forming the first well 220. The dopant type and concentration of the first well 220 are as described above. After the implant, the photoresist is removed, such as by ashing.

Figure 10:
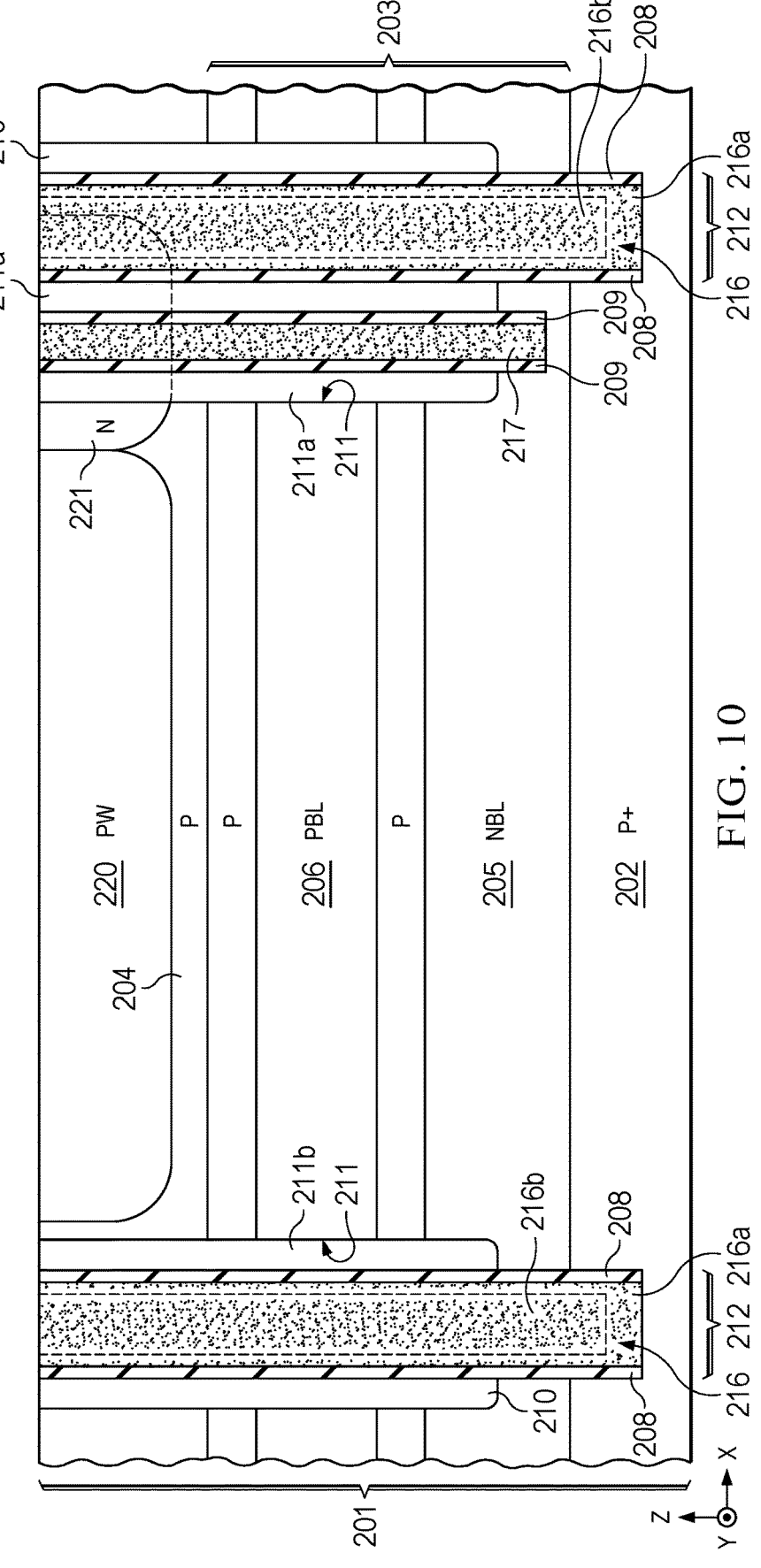

Referring to FIG. 10, the second well 221 is formed in the semiconductor substrate 201. To form the second well 221, a photoresist can be deposited (e.g., by spin-on) on or over the semiconductor substrate 201 and patterned using photolithography. The photoresist is patterned to have an opening corresponding to an area where the second well 221 is to be formed. With the patterned photoresist, an implant is performed to implant dopants into the semiconductor substrate 201 thereby forming the second well 221. The dopant type and concentration of the second well 221 are as described above. After the implant, the photoresist is removed, such as by ashing.

Figure 11:
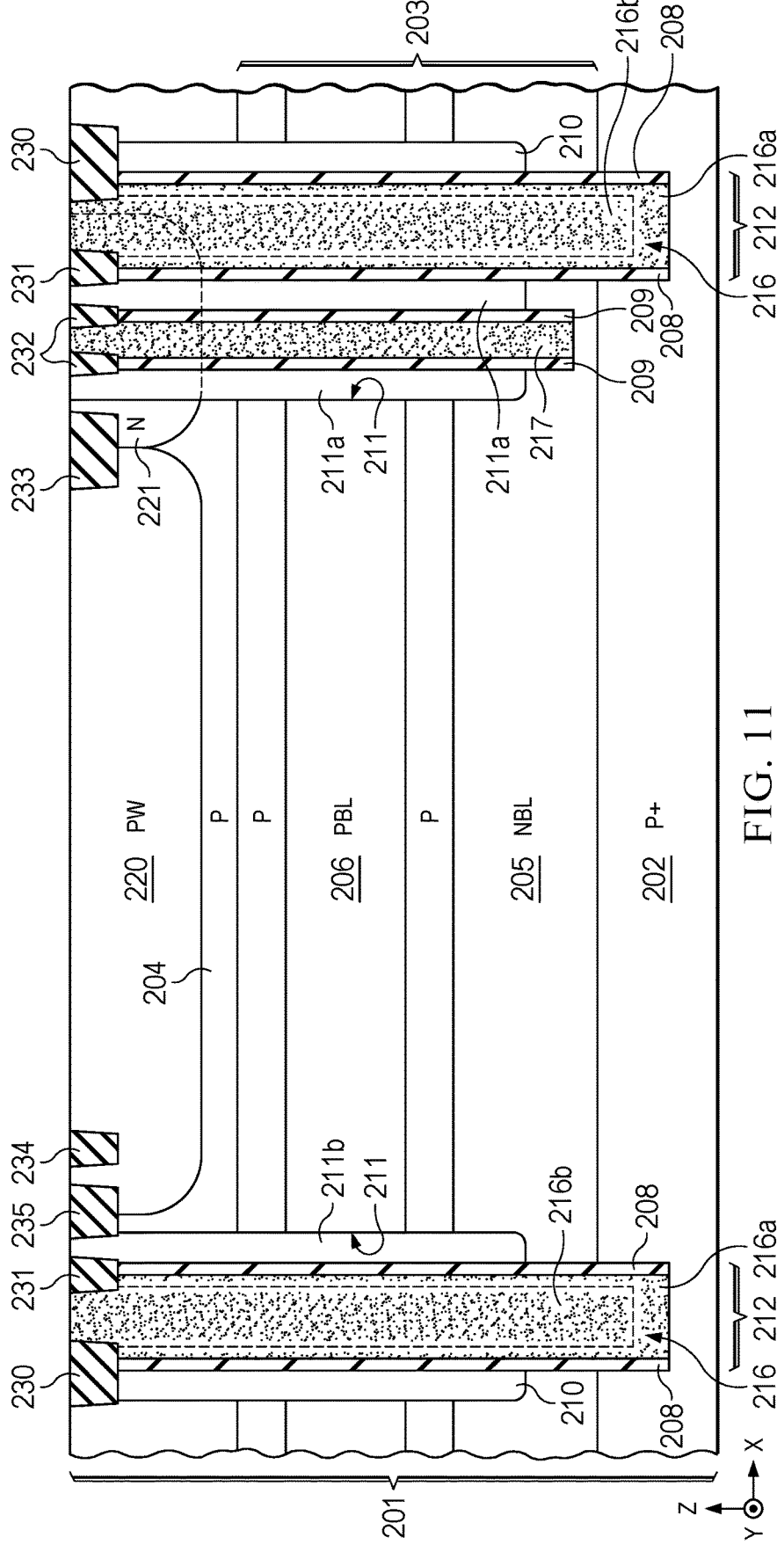

Referring to FIG. 11, the dielectric isolation regions 230-235 are formed in the semiconductor substrate 201. In the illustrated example, the dielectric isolation regions 230-235 are STIs, and in other examples, the dielectric isolation regions 230-235 can be or include other dielectric isolation regions, such as field oxide regions. To form the illustrated dielectric isolation regions 230-235, a hardmask can be deposited on or over the semiconductor substrate 201 and patterned using appropriate photolithography and etching processes. Using the patterned hardmask, trenches are etched into the semiconductor substrate 201. A dielectric material is deposited in the trenches. For example, the dielectric material can be or include a nitride, an oxide, the like, or a combination thereof and may be deposited using ALD, flowable CVD (FCVD), the like, or a combination thereof. Excess dielectric material and the hardmask can be removed, such as by using a CMP.

Figure 12:
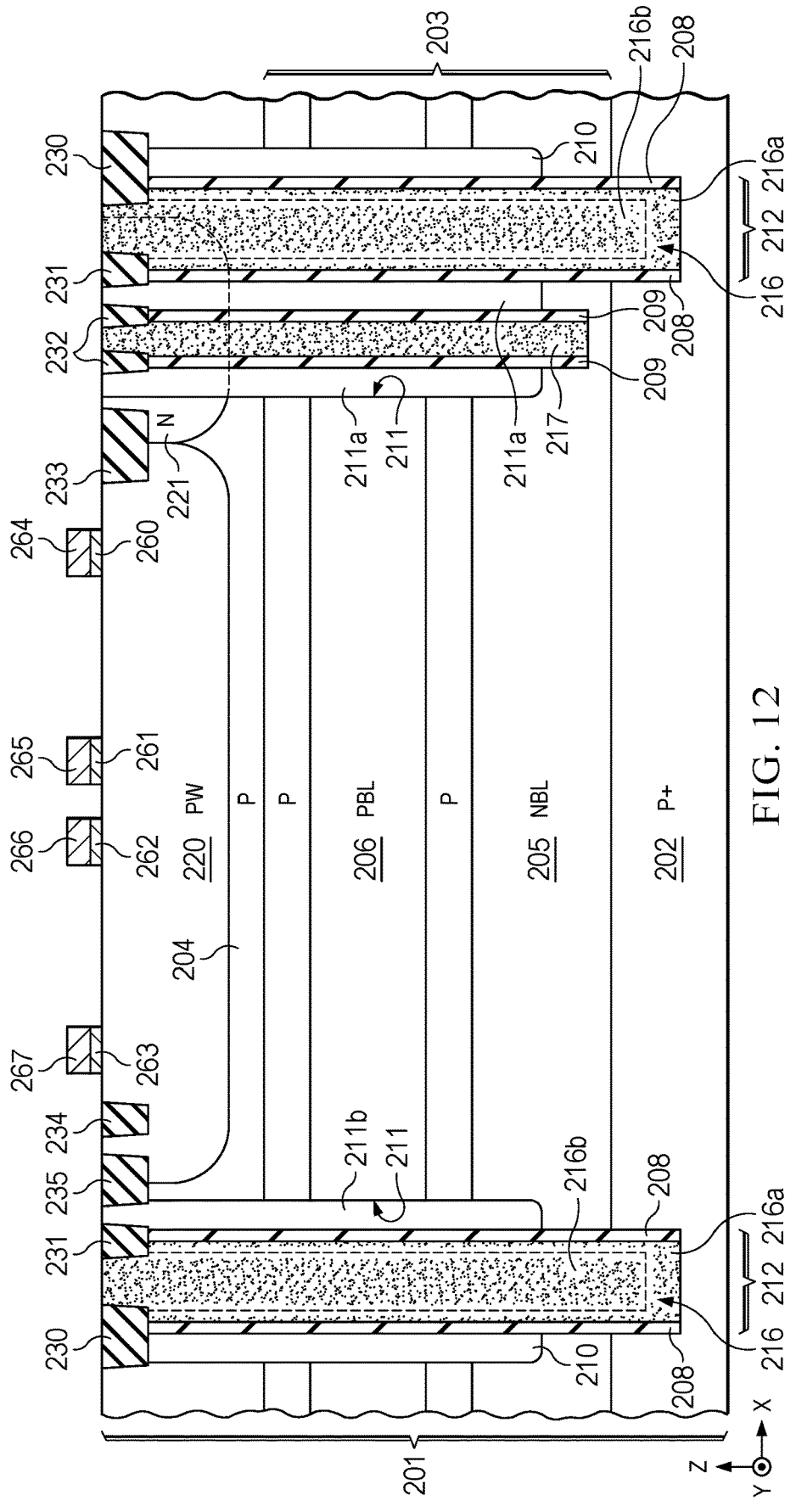

Referring to FIG. 12, a dielectric layer is formed on the top major surface of the semiconductor substrate 201, and a gate electrode layer is formed on the dielectric layer. In some examples, the dielectric layer is formed by performing an oxidation process to oxide the semiconductor material (e.g., silicon) at the top major surface of the semiconductor substrate 201. Hence, in such examples, the dielectric layer can be an oxide of the semiconductor material of the semiconductor substrate 201, such as silicon oxide. In other examples, the dielectric layer can be deposited on or over the semiconductor substrate 201 using an appropriate deposition process, such as, for example, CVD, ALD, or the like. The gate electrode layer can be or include, for example, polysilicon, metal, the like, or a combination thereof. The gate electrode layer can be deposited by any appropriate deposition process, such as CVD, PVD, or the like. The gate electrode layer and dielectric layer are then patterned into the gate electrode structures 264-267 and gate dielectric layers 260-263 using appropriate photolithography and etching processes. Additional processing can be performed to form other features of a gate structure, such as a gate spacer. Such description is omitted for simplicity.

Figure 13:
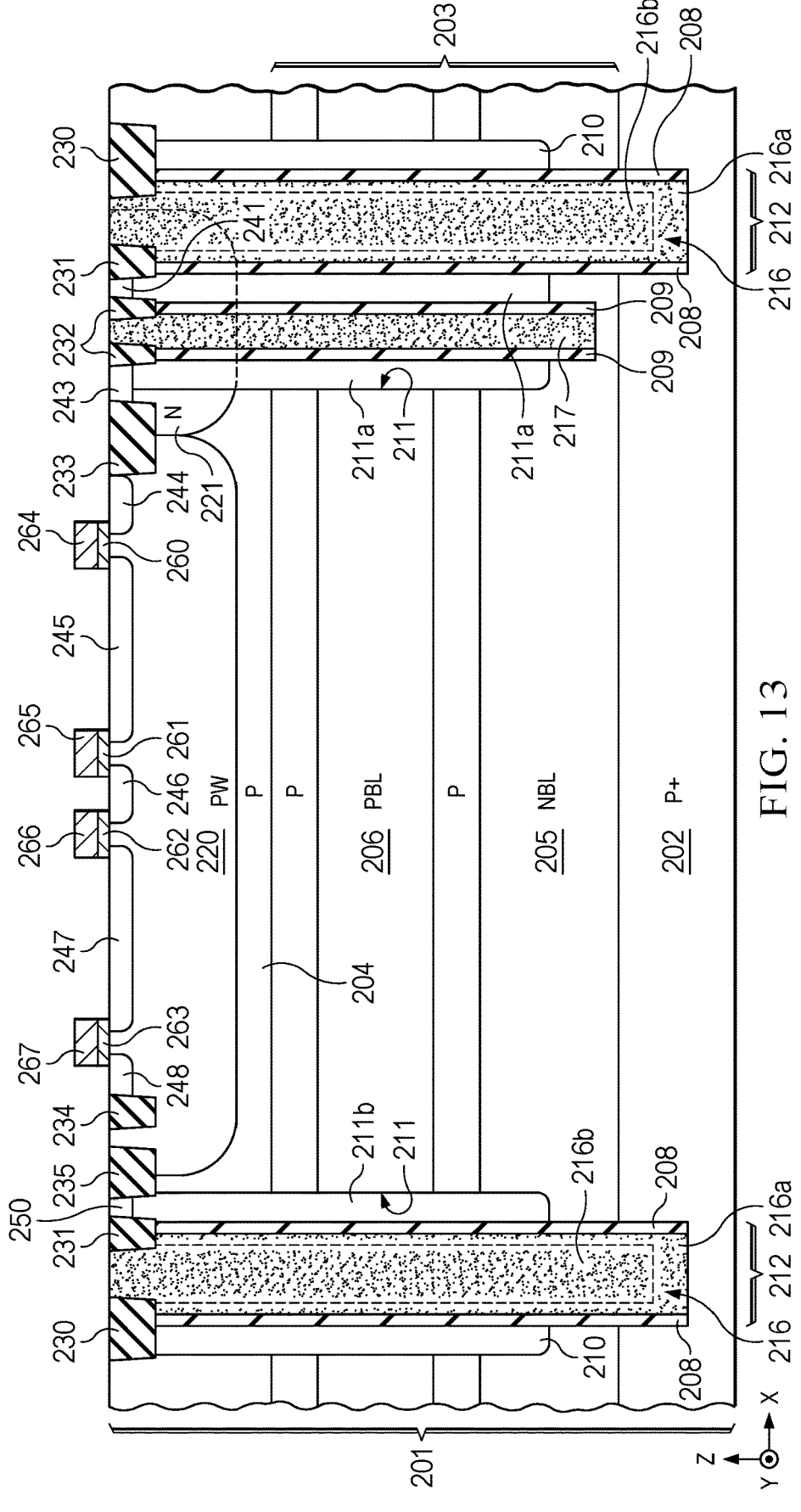

Referring to FIG. 13, the source regions 244, 246, 248, drain regions 245, 247, outer capacitor electrode contacts 241, 243, and contact region 250 are formed in the semiconductor substrate 201. To form these doped regions 241, 243-248, 250, a photoresist can be deposited (e.g., by spin-on) on or over the semiconductor substrate 201 and patterned using photolithography. The photoresist is patterned to have respective openings corresponding to areas where the doped regions 241, 243-248, 250 are to be formed. With the patterned photoresist, an implant is performed to implant dopants into the semiconductor substrate 201 thereby forming the doped regions 241, 243-248, 250. The dopant type and concentration of the doped regions 241, 243-248, 250 are as described above. After the implant, the photoresist is removed, such as by ashing.

Figure 14:
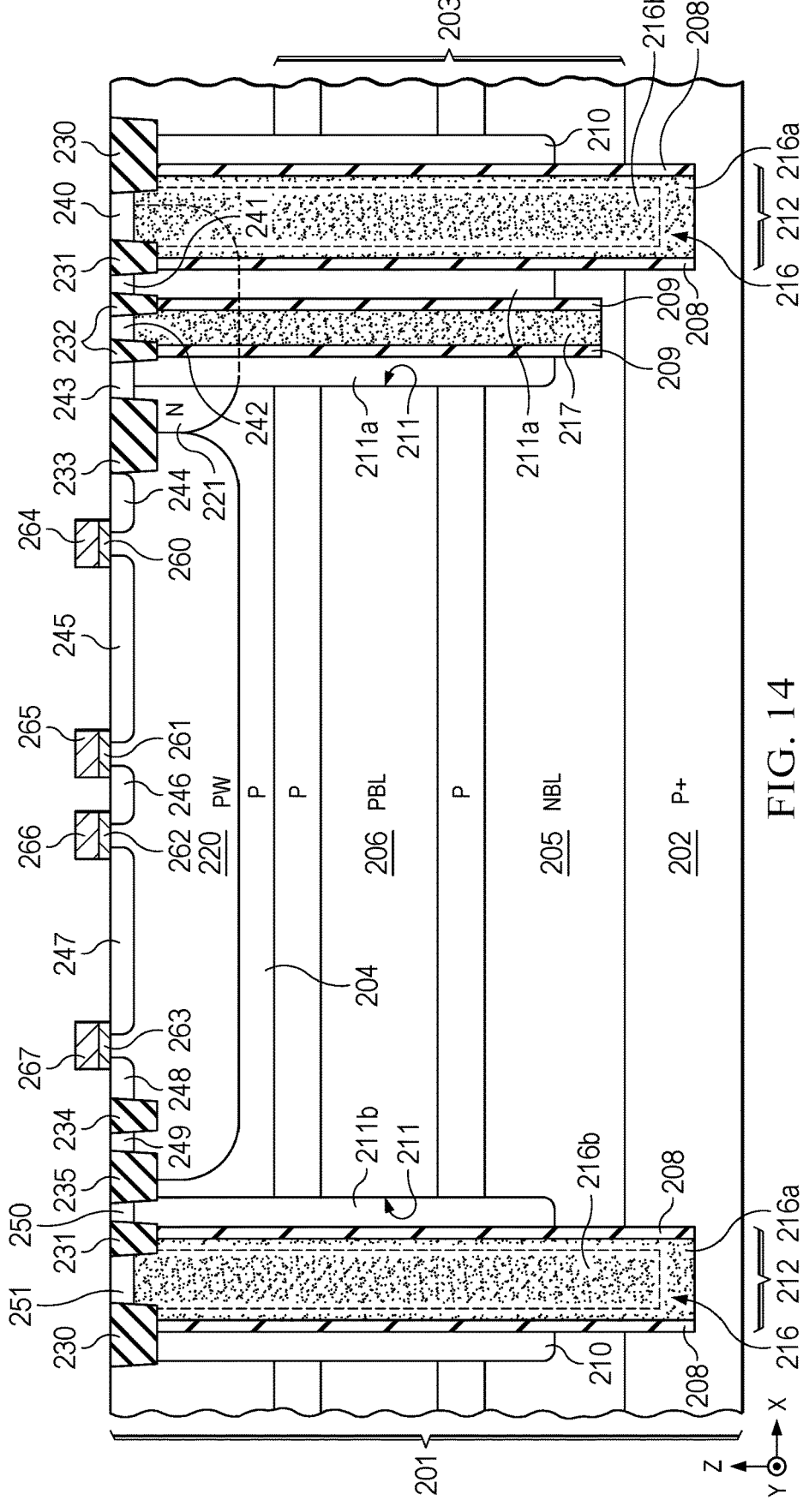

Referring to FIG. 14, the backgate contact 249, inner capacitor electrode contact 242, and substrate contact regions 240, 251 are formed in the semiconductor substrate 201. To form these doped regions 240, 242, 249, 251, a photoresist can be deposited (e.g., by spin-on) on or over the semiconductor substrate 201 and patterned using photolithography. The photoresist is patterned to have respective openings corresponding to areas where the doped regions 240, 242, 249, 251 are to be formed. With the patterned photoresist, an implant is performed to implant dopants into the semiconductor substrate 201 thereby forming the doped regions 240, 242, 249, 251. The dopant type and concentration of the doped regions 240, 242, 249, 251 are as described above. After the implant, the photoresist is removed, such as by ashing.

Figure 15:
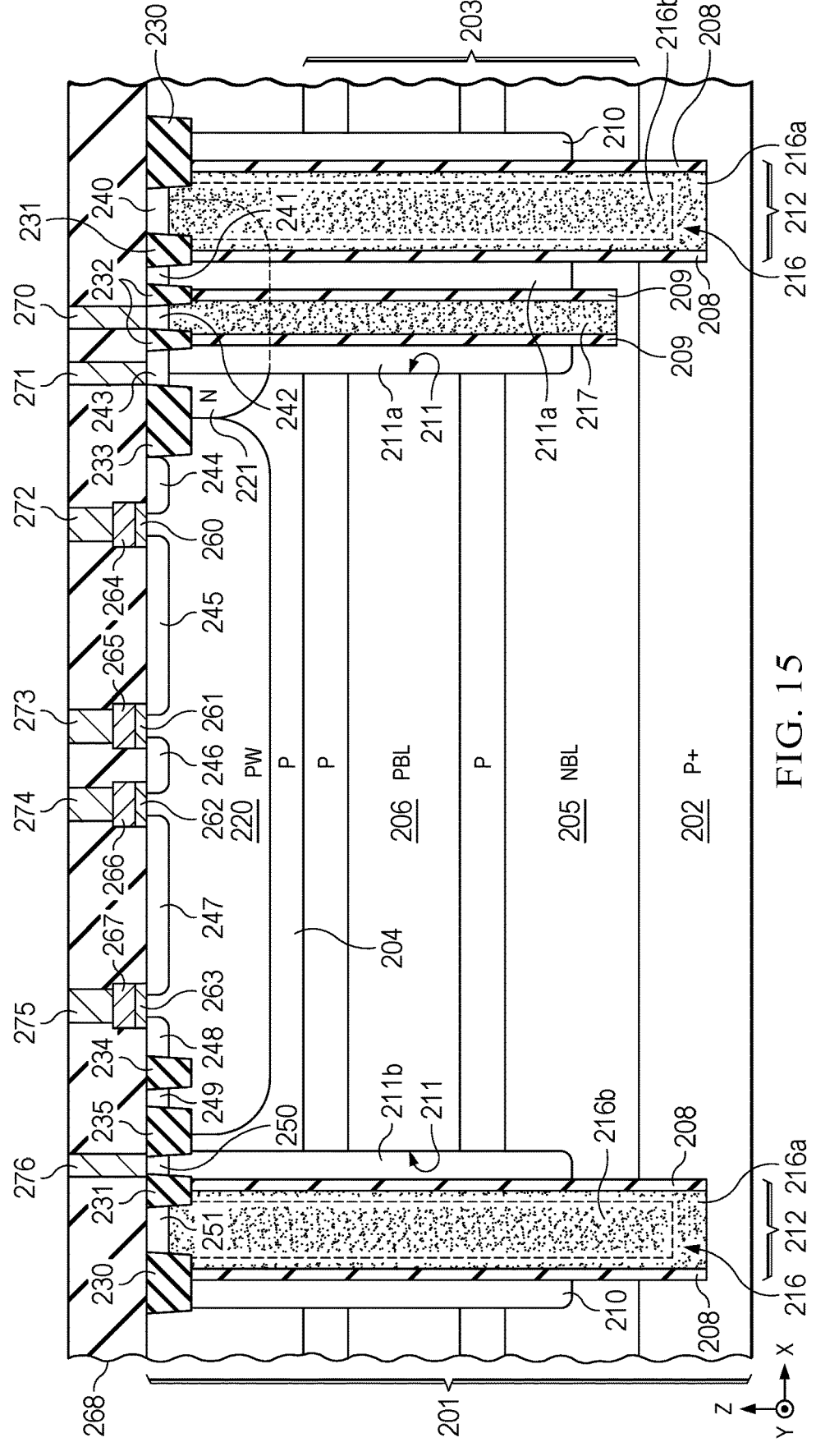

Referring to FIG. 15, the PMD layer 268 is formed, and contacts 270-276 and other contacts are formed through the PMD layer 268. The PMD layer 268 can include one or multiple dielectric layers formed of any appropriate dielectric material and deposited by any appropriate deposition process, such as CVD, PVD, or the like. Openings are then formed through the PMD layer 268 using photolithography and etching processes. As shown, respective openings expose respective doped regions 242, 243, 250 and gate electrode structures 264-267. Similarly, not shown, respective openings expose the source regions 244, 246, 248 and drain regions 245, 247. A metal-semiconductor compound may be formed on the doped regions 242-248, 250 and gate electrode structures 264-267 before the PMD layer 268 is formed and/or after forming openings to the doped regions 242-248, 250 and gate electrode structures 264-267. The metal-semiconductor compound can be formed by depositing a metal, such as by CVD, PVD, or the like, on the doped regions 242-248, 250 and gate electrode structures 264-267 (e.g., before the PMD layer 268 is formed or through the respective openings) and reacting the semiconductor material of the doped regions 242-248, 250 and gate electrode structures 264-267 using an anneal. A barrier and/or adhesion layer may be conformally deposited, such as by CVD, ALD, or the like, in the openings, and a fill metal can be deposited, such as by CVD, PVD, or the like, on the barrier and/or adhesion layer. Any barrier and/or adhesion layer and fill material on the top surface of the PMD layer 268 may be removed by CMP, for example. Hence, each of the contacts 270-276 and other contacts can include a semiconductor-metal compound, a barrier and/or adhesion layer, and a fill metal.

FIG. 2A illustrates the gate-coupled transistor cell 200 at a later stage of manufacturing, at which the IMD layer 278, metal vias 280-286, metal lines 290-292, other metal vias, and other metal lines have been formed in the IMD layer 278. The ID layer 278 can include one or multiple dielectric layers formed of any appropriate dielectric material and deposited by any appropriate deposition process, such as CVD, PVD, or the like. Recesses for metal lines 290-292 and other metal lines and openings for metal vias 280-286 and other vias are then formed through the IMD layer 278 using photolithography and etching processes. As shown, respective openings expose respective contacts 270-276. Although not shown, respective openings expose respective contacts that contact the source regions 244, 246, 248 and drain regions 245, 247. A barrier and/or adhesion layer may be conformally deposited, such as by CVD, ALD, or the like, in the recesses and openings, and a fill metal can be deposited, such as by CVD, PVD, or the like, on the barrier and/or adhesion layer. Any barrier and/or adhesion layer and fill material on the top surface of the IMD layer 278 may be removed by CMP, for example. Hence, each of the metal vias 280-286, metal lines 290-292, other metal vias, and other metal lines can include a barrier and/or adhesion layer and a fill metal. Various electrical coupling or connections of metal vias and metal lines formed in the IMD layer 278, even if not shown in FIG. 2A (e.g., to contacts in the PMD layer 268 that contact the source regions 244, 246, 248 and drain regions 245, 247), were described previously. Different processing may be performed to form metal lines and/or vias that electrically connect the various regions and gate electrode structures together.

Although various examples have been described in detail, it should be understood that various changes, substitutions, and alterations can be made therein without departing from the scope defined by the appended claims.

What is claimed is:

1. An integrated circuit comprising:
a transistor comprising a source region, a drain region, and a gate structure, the source region and the drain region having a first conductivity type and being disposed in a semiconductor layer having a top surface, the semiconductor layer having an opposite second conductivity type, the gate structure being disposed on or over the semiconductor layer;
a doped buried layer having the first conductivity type disposed in the semiconductor layer below the source region and the drain region; and
a capacitor disposed in the semiconductor layer, the capacitor comprising a first capacitor electrode and a second capacitor electrode, the first and second capacitor electrodes having the first conductivity type and extending from the top surface into the semiconductor layer, the capacitor further comprising a capacitor dielectric layer disposed between the first capacitor electrode and the second capacitor electrode, the first capacitor electrode being conductively coupled to the drain region, the second capacitor electrode being conductively coupled to the gate structure and conductively contacting the doped buried layer, the doped buried layer being conductively coupled to the source region.

2. The integrated circuit of claim 1, wherein the doped buried layer is conductively coupled to the source region by a resistive path through a vertical doped region located between the gate structure and the source region.

3. The integrated circuit of claim 1, wherein the first capacitor electrode and the capacitor dielectric layer are disposed in a recess in the semiconductor layer, the capacitor dielectric layer being disposed along a sidewall surface of the recess, the first capacitor electrode comprising a conductive material disposed on the capacitor dielectric layer.

4. The integrated circuit of claim 3, wherein the second capacitor electrode comprises a doped region in the semiconductor layer disposed along the sidewall surface of the recess.

5. The integrated circuit of claim 4, wherein the doped region of the second capacitor electrode extends from the top surface of the semiconductor layer to the doped buried layer.

6. The integrated circuit of claim 1, further comprising:
a trench ring isolation structure disposed in the semiconductor layer surrounding the transistor, the capacitor, and the doped buried layer, the trench ring isolation structure including a conductive material within a trench, the conductive material extending from the top surface of the semiconductor layer to a depth in the semiconductor layer below the doped buried layer; and
an inner doped region disposed in the semiconductor layer along a sidewall of the trench, the inner doped region extending to a depth in the semiconductor layer to the doped buried layer, the inner doped region touching the capacitor dielectric layer.

7. The integrated circuit of claim 1, wherein the first conductivity type is N-type and the second conductivity type is P-type.

8. The integrated circuit of claim 1, wherein the semiconductor layer includes a semiconductor substrate.

9. A method of forming an integrated circuit, the method comprising:
forming a doped buried layer having a first conductivity type in a semiconductor substrate having an opposite second conductivity type;
forming a first capacitor electrode having the first conductivity type along a sidewall of the semiconductor substrate, the first capacitor electrode extending from a first contact at a top surface of the semiconductor substrate to the doped buried layer;
forming a capacitor dielectric layer disposed along the first capacitor electrode disposed along the sidewall;
forming a second capacitor electrode having the first conductivity type that extends along the capacitor dielectric layer from a second contact at the top surface, the second contact isolated from the first contact at the top surface by a dielectric isolation structure;
forming a gate structure disposed on or over the semiconductor substrate;
forming a source region having the first conductivity type and a drain region having the first conductivity type disposed in the semiconductor substrate and on opposing lateral sides of the gate structure;
electrically coupling the first capacitor electrode to the gate structure;
electrically coupling the second capacitor electrode to the drain region; and
electrically coupling the doped buried layer to the source region.

10. The method of claim 9, wherein after electrically coupling the doped buried layer to the source region, a resistive path connects the doped buried layer to the source region.

11. The method of claim 9, further comprising forming a recess in the semiconductor substrate to a depth at or below the doped buried layer, the sidewall of the semiconductor substrate being a sidewall of the recess.

12. The method of claim 11, wherein forming the first capacitor electrode comprises implanting dopants in the sidewall of the recess, the first capacitor electrode being a doped region in the semiconductor substrate along the sidewall of the recess.

13. The method of claim 12, wherein implanting the dopants in the sidewall of the recess comprises performing a tilt implant.

14. The method of claim 11, further comprising:
forming a ring trench in the semiconductor substrate to a depth below the doped buried layer, the ring trench being formed simultaneously with formation of the recess;
forming a first doped region interior to the ring trench along a first trench sidewall of the ring trench, forming the first doped region comprising implanting dopants in the first trench sidewall of the ring trench, the first doped region forming, at least in part, the first capacitor electrode; and
forming a second doped region interior to the ring trench along a second trench sidewall of the ring trench, forming the second doped region comprising implanting dopants in the second trench sidewall of the ring trench, the second doped region contacting the doped buried layer, the doped buried layer being disposed laterally between the first doped region and the second doped region, wherein electrically coupling the doped buried layer to the source region comprises electrically coupling the second doped region to the source region.

15. An integrated circuit comprising:

an electrostatic discharge (ESD) protection circuit comprising:

a transistor comprising a source region, a drain region, and a gate structure, the source region and the drain region being disposed in a semiconductor substrate, the gate structure being disposed on or over the semiconductor substrate;

an effective resistance comprising a doped buried layer having a first conductivity type disposed in the semiconductor substrate below the transistor, the doped buried layer being electrically coupled between the gate structure and the source region; and an effective capacitance disposed in the semiconductor substrate and electrically coupled between the gate structure and the drain region, the effective capacitance comprising:

a first capacitor electrode having the first conductivity type disposed along a first sidewall of a trench in the semiconductor substrate and an opposing sidewall of the trench, the first capacitor electrode extending from first and second silicide contacts at a top surface of the semiconductor substrate to the doped buried layer;

a first capacitor dielectric layer disposed along the first capacitor electrode disposed along the first sidewall; and a second capacitor electrode having the first conductivity type disposed along the first capacitor dielectric layer and touching the doped buried layer, the second capacitor electrode located between the first and second silicide contacts.

16. The integrated circuit of claim 15, wherein the first capacitor electrode is further disposed along a second sidewall in the semiconductor substrate, the effective capacitance further comprising:

a second capacitor dielectric layer disposed along the first capacitor electrode disposed along the second sidewall; and a third capacitor electrode disposed along the second capacitor dielectric layer, the second capacitor electrode and the third capacitor electrode being electrically connected together.

17. The integrated circuit of claim 15, wherein the first capacitor electrode comprises a doped region of the semiconductor substrate.

18. The integrated circuit of claim 15, wherein the ESD protection circuit further comprises a trench ring isolation structure disposed in the semiconductor substrate, wherein the transistor, the effective resistance, and the effective capacitance are disposed laterally interior to the trench ring isolation structure.

19. The integrated circuit of claim 15, wherein:

the ESD protection circuit comprises:

a first doped region disposed in the semiconductor substrate extending to a depth in the semiconductor substrate at least to the doped buried layer, the first doped region contacting the doped buried layer; and a second doped region disposed in the semiconductor substrate extending to a depth in the semiconductor substrate at least to the doped buried layer, the second doped region contacting the doped buried layer, the doped buried layer being disposed laterally between the first doped region and the second doped region;

the first doped region, the doped buried layer, and the second doped region are electrically coupled between the gate structure and the source region; and the first doped region forms at least a part of the first capacitor electrode.

20. The integrated circuit of claim 19, wherein:

the ESD protection circuit comprises:

a third doped region disposed in the semiconductor substrate extending to a depth in the semiconductor substrate, the third doped region laterally connecting to the first doped region and the second doped region, wherein the first doped region, the second doped region, and the third doped region forms, at least in part, a doped ring disposed in the semiconductor substrate.

* * * * *